United States Patent
Kobayashi et al.

(10) Patent No.: US 11,115,612 B2
(45) Date of Patent: Sep. 7, 2021

(54) SOLID-STATE IMAGE SENSOR AND IMAGE CAPTURE APPARATUS

(71) Applicant: CANON KABUSHIKI KAISHA, Tokyo (JP)

(72) Inventors: Hirokazu Kobayashi, Tokyo (JP); Satoshi Suzuki, Tokyo (JP); Satoshi Kumaki, Kawaguchi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 119 days.

(21) Appl. No.: 16/114,733

(22) Filed: Aug. 28, 2018

(65) Prior Publication Data
US 2019/0068908 A1 Feb. 28, 2019

(30) Foreign Application Priority Data

Aug. 31, 2017 (JP) ............................. JP2017-167639
Jul. 17, 2018 (JP) ............................. JP2018-134479

(51) Int. Cl.
*H04N 5/369* (2011.01)
*H04N 5/376* (2011.01)
(Continued)

(52) U.S. Cl.
CPC ......... *H04N 5/3765* (2013.01); *G01S 7/4863* (2013.01); *G01S 17/894* (2020.01);
(Continued)

(58) Field of Classification Search
None
See application file for complete search history.

(56) References Cited

U.S. PATENT DOCUMENTS

| 2006/0131480 A1 | 6/2006 | Charbon et al. |
| 2006/0192086 A1 | 8/2006 | Niclass et al. |

(Continued)

FOREIGN PATENT DOCUMENTS

| CN | 101635860 A | 1/2010 |
| CN | 105895645 A | 8/2016 |

(Continued)

OTHER PUBLICATIONS

Brian F Aull et al. Geiger-mode avalanche photodiodes for three-dimensional imaging, The Lincoln Laboratory Journal, New York, NY, US, vol. 13, No. 2, Jan. 1, 2002, pp. 335-350, XP002312996.

(Continued)

*Primary Examiner* — Mulugeta Mengesha
*Assistant Examiner* — Charles N Hicks
(74) *Attorney, Agent, or Firm* — Cowan, Liebowitz & Latman, P.C.

(57) ABSTRACT

A solid-state image sensor and an image capture apparatus are provided that can realize image acquisition and distance measurement while restraining the circuit scale from increasing. The solid-state image sensor includes a plurality of pixels each including a sensor unit that generates a pulse with a frequency that is based on a reception frequency of a photon, and a counter that can operate in a first mode of counting the number of pulses of a signal generated by the sensor unit, and a second mode of counting the number of pulses of a predetermined signal that is based on an elapsed time from a timing at which light is emitted from a light emitting unit.

11 Claims, 17 Drawing Sheets

(51) Int. Cl.
| | | |
|---|---|---|
| *G06T 7/521* | (2017.01) | |
| *H04N 5/3745* | (2011.01) | |
| *H04N 5/341* | (2011.01) | |
| *H04N 5/343* | (2011.01) | |
| *G01S 7/4863* | (2020.01) | |
| *G01S 17/894* | (2020.01) | |
| *H01L 27/146* | (2006.01) | |
| *H04N 5/06* | (2006.01) | |
| *H01L 31/107* | (2006.01) | |
| *H04N 5/378* | (2011.01) | |

(52) U.S. Cl.
CPC ............ *G06T 7/521* (2017.01); *H04N 5/341* (2013.01); *H04N 5/343* (2013.01); *H04N 5/3696* (2013.01); *H04N 5/36965* (2018.08); *H04N 5/3745* (2013.01); *H04N 5/37455* (2013.01); *G06T 2207/10028* (2013.01); *H01L 27/14607* (2013.01); *H01L 27/14621* (2013.01); *H01L 27/14627* (2013.01); *H01L 27/14645* (2013.01); *H01L 27/14649* (2013.01); *H01L 31/107* (2013.01); *H04N 5/06* (2013.01); *H04N 5/378* (2013.01)

(56) References Cited

U.S. PATENT DOCUMENTS

| | | | |
|---|---|---|---|
| 2010/0020209 A1* | 1/2010 | Kim | H04N 3/155 348/294 |
| 2012/0104234 A1 | 5/2012 | Kudo | |
| 2012/0205522 A1 | 8/2012 | Richardson et al. | |
| 2015/0285625 A1 | 10/2015 | Deane | |
| 2016/0043146 A1* | 2/2016 | Uesaka | H01L 51/5024 257/40 |
| 2016/0084703 A1 | 3/2016 | Shaber | |
| 2017/0131143 A1 | 5/2017 | Andreou et al. | |
| 2018/0128921 A1* | 5/2018 | Mattioli Della Rocca | G01S 17/32 |
| 2019/0079167 A1* | 3/2019 | Gaalema | G01S 7/489 |
| 2019/0094015 A1* | 3/2019 | Wang | G03B 15/02 |

FOREIGN PATENT DOCUMENTS

| | | |
|---|---|---|
| CN | 106911888 A | 6/2017 |
| EP | 2 148 514 A1 | 1/2010 |
| EP | 3 182 156 A1 | 6/2017 |
| EP | 3 185 037 A1 | 6/2017 |
| GB | 2487958 A | 8/2012 |
| JP | 2014-081253 A | 5/2014 |
| JP | 2015-173432 A | 10/2015 |
| KR | 10-2005-0069864 A | 7/2005 |
| KR | 10-2010-0011676 A | 2/2010 |
| KR | 10-2013-0026393 A | 3/2013 |
| NO | 2017/098725 A1 | 6/2017 |

OTHER PUBLICATIONS

Brian F Aull "Silicon Geiger-mode avalanche photodiode arrays for photon-starved imaging", Visual Communications and Image Processing; Jan. 20, 2004-Jan. 20, 2004; San Jose, vol. 9492, May 13, 2015, pp. 94920M-1-94920M-9, XP060053059, DOI: 10.1117/12.2179794, ISBN: 978-1-62841-730-2.

Cristiano Niclass et al. "A CMOS 3D camera with Millimetric Depth Resolution", Custom Integrated Circuits Conference, 2004. Proceedings of the IEEE 2004, IEEE, Piscataway, NJ, USA, Oct. 3, 2004, pp. 705-708, XP010742419, DOI: 10. 1109/CICC.2004.1358925, ISBN: 978-0/7803-8495-8.

The above references were cited in a Oct. 31, 2018 European Search Report, which is enclosed, that issued in European Patent Application No. 18 18 9296.9.

The above foreign patent documents were cited in the Jan. 28, 2021 Korean Office Action, which is enclosed with an English Translation, that issued in Korean Patent Application No. 10-2018-0100055.

The above documents were cited in a Dec. 16, 2020 Chinese Office Action, which is enclosed with an English Translation, that issued in Chinese Patent Application No. 201811014819.8.

* cited by examiner

| Area (1,1) | Area (1,2) | Area (1,3) | Area (1,4) | Area (1,5) | Area (1,6) | Area (1,7) | Area (1,8) |
|---|---|---|---|---|---|---|---|
| Area (2,1) | Area (2,2) | Area (2,3) | Area (2,4) | Area (2,5) | Area (2,6) | Area (2,7) | Area (2,8) |
| Area (3,1) | Area (3,2) | Area (3,3) | Area (3,4) | Area (3,5) | Area (3,6) | Area (3,7) | Area (3,8) |
| Area (4,1) | Area (4,2) | Area (4,3) | Area (4,4) | Area (4,5) | Area (4,6) | Area (4,7) | Area (4,8) |
| Area (5,1) | Area (5,2) | Area (5,3) | Area (5,4) | Area (5,5) | Area (5,6) | Area (5,7) | Area (5,8) |
| Area (6,1) | Area (6,2) | Area (6,3) | Area (6,4) | Area (6,5) | Area (6,6) | Area (6,7) | Area (6,8) |
| Area (7,1) | Area (7,2) | Area (7,3) | Area (7,4) | Area (7,5) | Area (7,6) | Area (7,7) | Area (7,8) |
| Area (8,1) | Area (8,2) | Area (8,3) | Area (8,4) | Area (8,5) | Area (8,6) | Area (8,7) | Area (8,8) |

SOLID-STATE IMAGE SENSOR AND IMAGE CAPTURE APPARATUS

BACKGROUND OF THE INVENTION

Field of the Invention

The present invention relates to a solid-state image sensor and an image capture apparatus.

Description of the Related Art

A technique of detecting a single photon using an avalanche photodiode (APD) has conventionally been proposed. If a single photon is incident on an avalanche photodiode to which a reverse bias voltage that is greater than a breakdown voltage is applied, a carrier is generated, avalanche multiplication occurs, and a large current is generated. The single photon can be detected based on this current. This avalanche photodiode is called a SPAD (Single Photon Avalanche Diode). Japanese Patent Laid-Open No. 2014-81253 discloses a photodetector in which an avalanche photodiode is provided in a light-receiving device. Japanese Patent Laid-Open No. 2015-173432 discloses an image sensor in which each pixel includes a storage capacitor for storing charges generated by a photoelectric conversion element, a comparator that outputs a pulse if the voltage at the storage capacitor matches a reference voltage, and a reset transistor that is turned on by this pulse to reset the voltage at the storage capacitor.

However, if both image acquisition and distance measurement are to be realized using a SPAD, the circuit scale will increase.

SUMMARY OF THE INVENTION

The present invention provides a solid-state image sensor and an image capture apparatus that can realize image acquisition and distance measurement while restraining the circuit scale from increasing.

According to an aspect of the present invention, there is provided a solid-state image sensor comprising: a plurality of pixels each including a sensor unit that generates a pulse with a frequency that is based on a reception frequency of a photon; and a counter that operates in any one of a first mode of counting the number of pulses of a signal generated by the sensor unit, and a second mode of counting the number of pulses of a predetermined signal that is based on an elapsed time from a timing at which light is emitted from a light emitting unit.

According to another aspect of the present invention, there is provided an image capture apparatus comprising: a solid-state image sensor comprising a plurality of pixels each including a sensor unit that generates a pulse with a frequency that is based on a reception frequency of a photon, and a counter that operates in any one of a first mode of counting the number of pulses of a signal generated by the sensor unit, and a second mode of counting the number of pulses of a predetermined signal that is based on an elapsed time from a timing at which light is emitted from a light emitting unit; and a signal processing unit that processes a signal output from the solid-state image sensor.

According to a further aspect of the present invention, there is provided an image capture apparatus comprising: a solid-state image sensor comprising a sensor unit that generates a pulse signal with a frequency that is based on a reception frequency of a photon, and a counter that counts the number of pulses of the pulse signal; and a control unit that drives and controls the solid-state image sensor so as to operate in one of a first mode of capturing an image of a subject and a second mode of acquiring information regarding the distance to the subject.

Further features of the present invention will become apparent from the following description of exemplary embodiments with reference to the attached drawings.

BRIEF DESCRIPTION OF THE DRAWINGS

FIG. 7 conceptually illustrates respective areas of a pixel array included in the solid-state image sensor according to a third embodiment.

DESCRIPTION OF THE EMBODIMENTS

Exemplary embodiments of the present invention will now be described in detail in accordance with the accompanying drawings.

Note that the present invention is not limited to the following embodiments, and can be modified as appropriate.

First Embodiment

Figure 1:
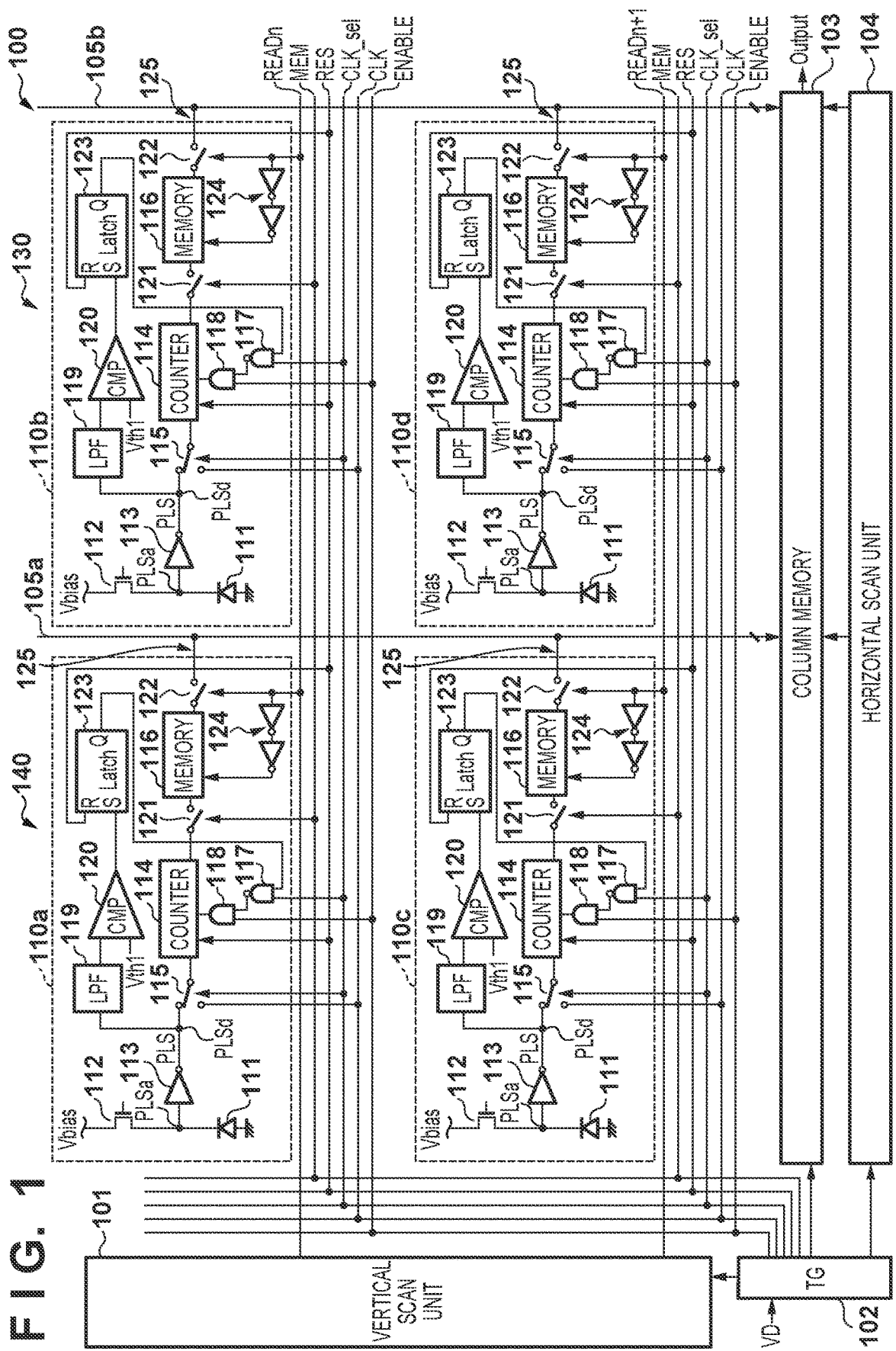
FIG. 1 shows a solid-state image sensor according to a first embodiment.

A solid-state image sensor and an image capture apparatus according to the first embodiment will be described with reference to FIGS. 1 to 4C. FIG. 1 illustrates a solid-state image sensor according to this embodiment.

As shown in FIG. 1, a solid-state image sensor 100 according to this embodiment includes a vertical scan unit 101, a timing generator (TG) 102, a column memory 103, and a horizontal scan unit 104. The solid-state image sensor 100 is also provided with a pixel array 130. The pixel array 130 is provided with a plurality of unit pixels 140, each including a plurality of pixels 110. FIG. 1 shows one unit pixel 140, out of the plurality of unit pixels 140 provided in the pixel array 130. The solid-state image sensor 100 includes a plurality of pixels 110, which are arranged in a matrix. Although four pixels 110a, 110b, 110c, and 110d are shown here to simplify the description, a large number of pixels 110 are provided in the pixel array 130 in practice. Reference numeral 110 is used to describe pixels in general, and reference numerals 110a to 110d are used to describe individual pixels.

Figure 4A:
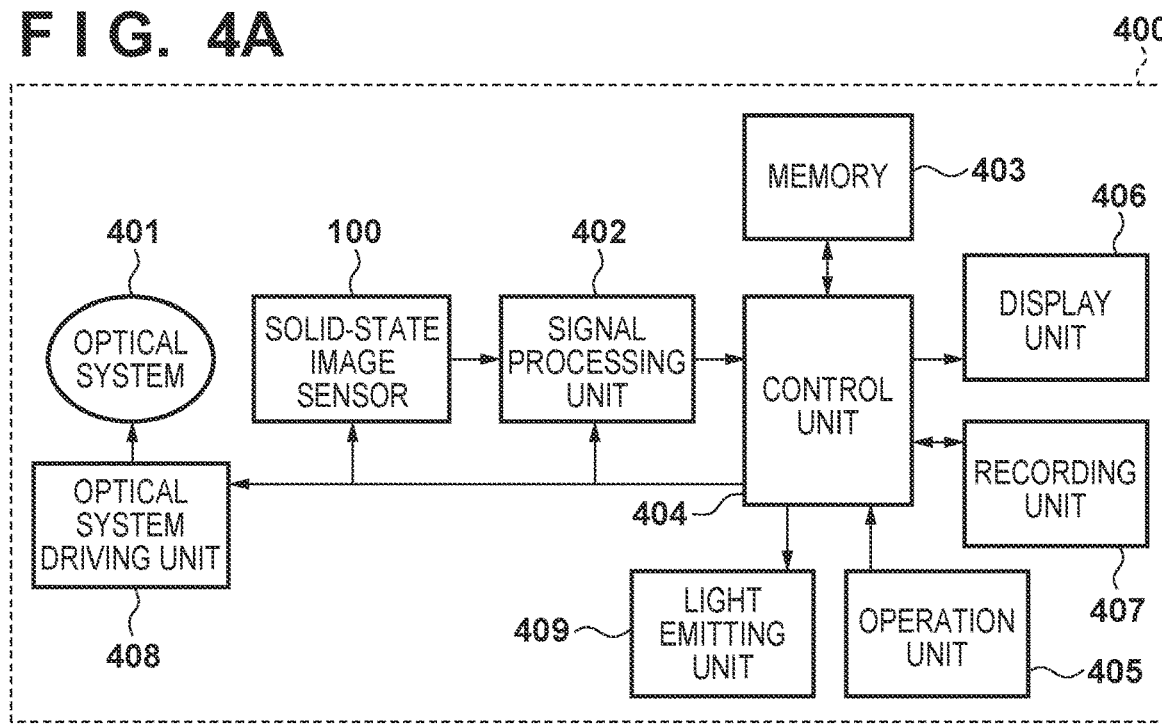
FIGS. 4A and 4B are block diagrams illustrating an image capture apparatus.
Figure 4B:
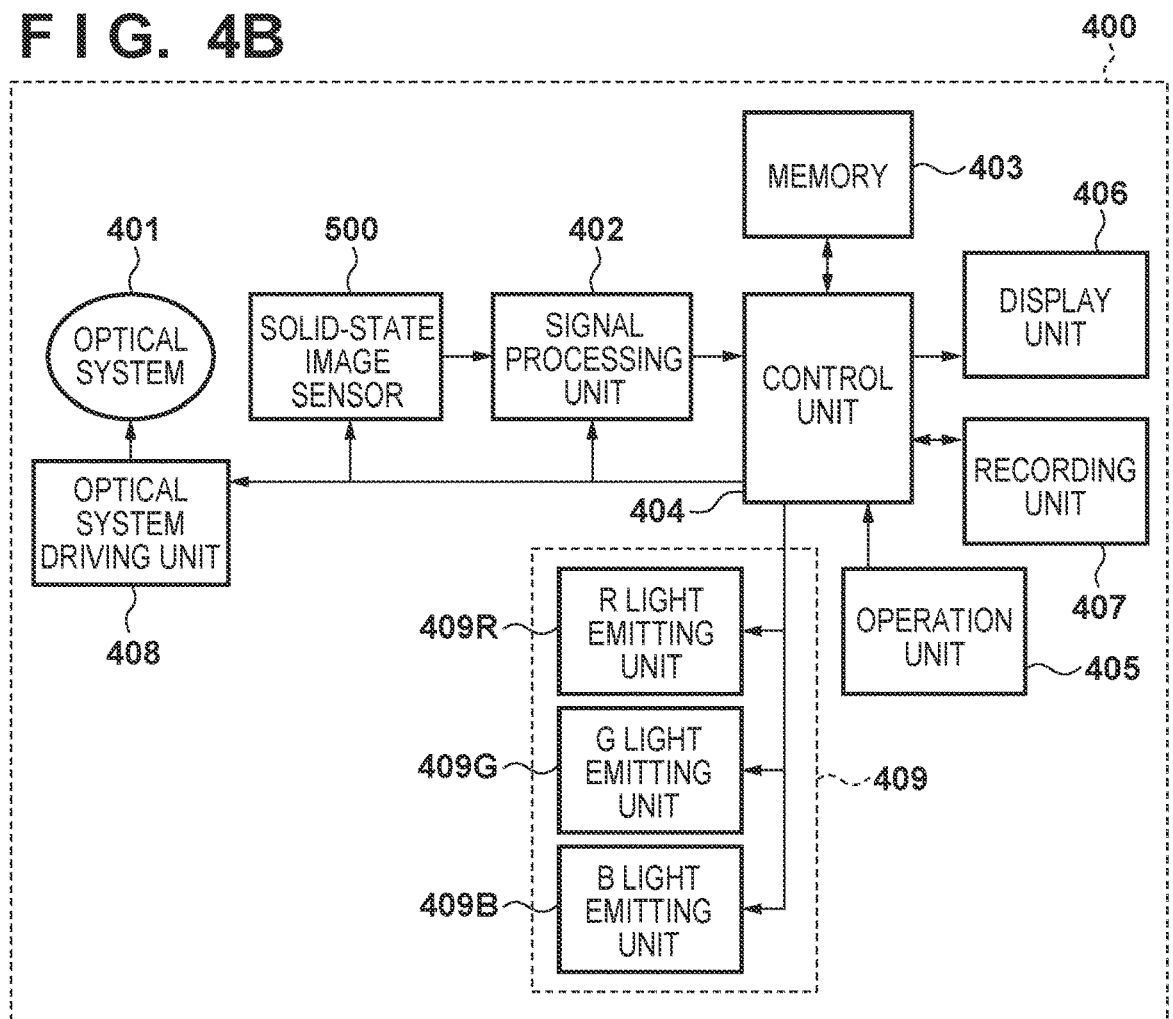
Figure 4C:
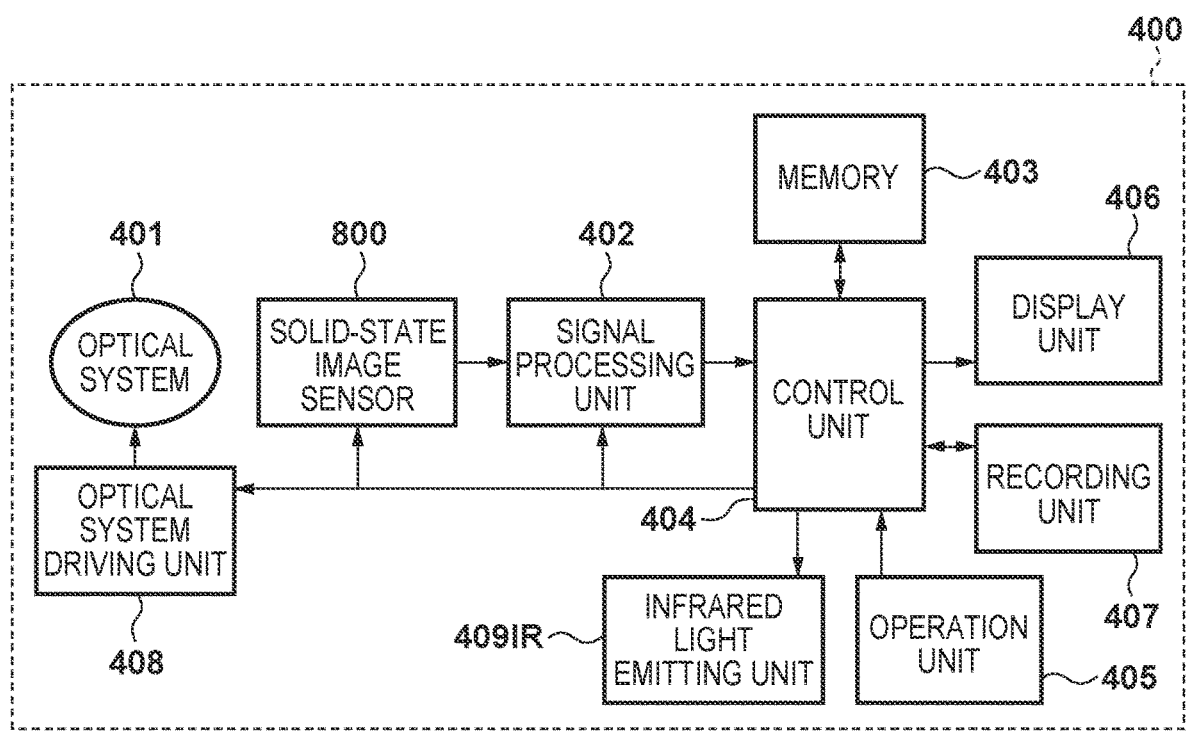
FIG. 4C is a block diagram illustrating the image capture apparatus.

The timing generator 102 generates a signal for controlling each unit in the solid-state image sensor 100 based on control signals or the like provided from a control unit 404 (see FIGS. 4A to 4C). A synchronizing signal VD or the like is provided to the timing generator 102 from the control unit 404. The timing generator 102 provides various signals or the like to the vertical scan unit 101, the column memory 103, and the horizontal scan unit 104. The timing generator 102 provides various control signals to the respective pixels 110. The timing generator 102 functions as a control unit for controlling each unit in the solid-state image sensor 100.

Each pixel 110 is provided with a SPAD 111, a quenching element 112, an inverter 113, a counter 114, an input selection switch 115, and a pixel memory 116. Each pixel 110 is also provided with a NAND element 117, an AND element 118, an LPF (low pass filter) 119, a comparator (CMP) 120, a transfer switch 121, a readout switch 122, an SR latch circuit 123, and a delay circuit 124.

An anode of the SPAD 111 is connected to a ground potential, and a cathode of the SPAD 111 is connected to one end of the quenching element (quenching resistor) 112. A bias voltage Vbias is applied to the other end of the quenching element 112. A bias voltage Vbias that is greater than a breakdown voltage of the SPAD 111 is applied to the SPAD 111 via the quenching element 112. Thus, the SPAD 111 operates in a Geiger mode. That is to say, an avalanche multiplication phenomenon is caused if a single photon is incident on the SPAD 111. As a result, an avalanche current is generated, and a voltage drop occurs in the quenching element 112. The quenching element 112 is a resistor element for stopping the avalanche multiplication phenomenon that occurs at the SPAD 111. Here, the quenching element 112 is configured using a resistance component of a MOS transistor. If an avalanche current is generated due to the avalanche multiplication phenomenon, a voltage drop occurs in the quenching element 112, and the bias voltage applied to the SPAD 111 drops. Upon the bias voltage dropping to the breakdown voltage, the avalanche multiplication phenomenon stops. As a result, the avalanche current no longer flows, and the bias voltage Vbias is applied again to the SPAD 111. The cathode of the SPAD 111, one end of the quenching element 112, and an input terminal of the inverter 113 are connected to one another at a node PLSa. An output terminal of the inverter 113, one input terminal of the input selection switch 115, and an input terminal of the LPF 119 are connected to one another at a node PLSd. If a single photon is incident on the SPAD 111, the aforementioned phenomenon occurs, and thus, the voltage changes at the node PLSa. The inverter 113 generates a pulse signal PLS in accordance with a voltage change at the node PLSa, and outputs the generated pulse signal PLS to the node PLSd. Thus, a pulse signal PLS whose waveform has been shaped is output from the inverter 113. Thus, in a sensor unit 303 (see FIGS. 3A and 3B), if a single photon is incident on the SPAD 111, the pulse signal PLS is output from the inverter 113 with a frequency that corresponds to the reception frequency of a single photon. The bias voltage Vbias can be set to about +20 V, for example, but is not limited thereto. For example, the anode of the SPAD 111 may be connected to a negative potential.

If the input selection switch 115 is set so that the node PLSd is connected to an input terminal of the counter 114, the number of pulses of the pulse signal PLS output from the inverter 113 is counted by the counter 114. The bit width of the counter 114 is 16, for example. The upper limit value of the countable value of the counter 114 with a bit width of 16, i.e. the count upper limit value is 0xFFFF (a decimal value of 65535). The count value obtained by the counter 114 counting the pulse signal PLS will be referred to as an imaging count value. The imaging count value, which is obtained by counting the number of pulses of the pulse signal PLS output from the inverter 113, depends on the amount of light received by the SPAD 111.

A clock signal (predetermined signal) CLK, which has a predetermined cycle and is provided from the timing generator 102, is input to the other input terminal of the input selection switch 115. If the input selection switch 115 is set so that the clock signal CLK is provided to the input terminal of the counter 114, the number of pulses of the clock signal CLK is counted by the counter 114. The input selection switch 115 is controlled by a control signal CLK_sel, which is provided from the timing generator 102. If the control signal CLK_sel is at the Low level, the input selection switch 115 is set so that the pulse signal PLS output from the inverter 113 is input to the input terminal of the counter 114. If the control signal CLK_sel is at the High level, the input selection switch 115 is set so that the clock signal CLK is input to the input terminal of the counter 114. The count value obtained by the counter 114 counting the clock signal CLK will be referred to as a ranging count value. The ranging count value, which is obtained by counting the clock signal CLK with a predetermined cycle, is proportional to elapsed time.

A reset signal (reset pulse) RES, which is provided from the timing generator 102, is input to a reset terminal of the counter 114. The count value of the counter 114 is reset to 0x0 by the reset signal RES. Upon reset being released, the counter 114 starts counting. If the reset signal RES is provided at a timing at which a later-described light emitting unit 409 (see FIGS. 4A to 4C) emits light, the elapsed time since the light emission timing can be understood.

An enable signal ENABLE for controlling whether or not to cause the counter 114 to operate is provided to an enable terminal of the counter 114 from the timing generator 102 via the AND element 118. The enable signal ENABLE is input to one input terminal of the AND element 118. The counter 114 performs a counting operation if the enable terminal of the counter 114 is at the High level, and the counter 114 stops the counting operation if the enable terminal of the counter 114 is at the Low level. A signal output from the NAND element 117 is provided to the other input terminal of the AND element 118. The control signal CLK_sel is provided to one input terminal of the NAND element 117, and a signal output from the comparator 120 is provided to the other input terminal of the NAND element 117. The NAND element 117 outputs a non-conjunction of the control signal CLK_sel and the signal output from the comparator 120. Only when the enable signal ENABLE is at the High level, and the output of the NAND element 117 is at the High level, the output of the AND element 118 is at the High level, and the counter 114 performs the counting operation. Accordingly, if the enable signal ENABLE is at the High level, whether or not the counter 114 operates is only determined by the signal output from the NAND element 117. Only when the control signal CLK_sel is at the High level, and the output of the comparator 120 is at the High level, the output of the NAND element 117 is at the Low level. Accordingly, when the enable signal ENABLE is at the High level, whether or not to cause the counter 114 to operate is controlled by the output of the comparator 120 only when the control signal CLK_sel is at the High level. That is to say, when the enable signal ENABLE is at the High level, whether or not to cause the counter 114 to operate is controlled by the output of the comparator 120 only when the ranging count value is obtained by the counter 114. When the control signal CLK_sel is at the Low level, i.e. the imaging count value is obtained by the counter 114, the counter 114 can always perform the counting operation if the enable signal ENABLE is at the High level.

The pulse signal PLS output from the inverter 113 is provided to one input terminal of the comparator 120 via the LPF 119, which cuts off a high frequency. Note that a LPF that has a known configuration can be used as the LPF 119 as appropriate. For example, the LPF may be constituted by an RC circuit, or may be constituted by an LC circuit. An op-amp may be provided in the LPF.

If the amount of light received by the pixel 110 is small, a pulse signal PLS that is temporally sparse is input to the LPF 119, and accordingly, the output voltage of the LPF 119 is relatively low. On the other hand, if the amount of light received by the pixel 110 is large, a pulse signal PLS that is temporally dense is input to the LPF 119, and accordingly, the output voltage of the LPF 119 is relatively high.

The voltage at the other input terminal of the comparator 120 is set to a first threshold Vth1. The comparator 120 can detect, in real time, a change in the amount of light received by the pixel 110, based on a change in the output voltage of the LPF 119. A Low-level signal is output from the comparator 120 if the output voltage of the LPF 119 is smaller than the first threshold Vth1, and a High-level signal is output from the comparator 120 if the output voltage of the LPF 119 is greater than or equal to the first threshold Vth1. For this reason, if the amount of light received by the pixel 110 has become large, the counting operation of the counter 114 is stopped through the NAND element 117 and the AND element 118. Thereafter, even if the amount of light received by the pixel 110 decreases, the SR latch circuit 123 keeps a Q terminal at the High level. For this reason, the stoppage of the counting operation of the counter 114 is maintained until the reset signal RES input to the reset terminal of the counter 114 is switched to the High level. Thus, a ranging count value is obtained that is based on a difference between the timing at which the light emitting unit 409 emits light and the timing at which the light reflected off a subject is received by the pixel 110. The time of flight of light tTOF, which is an example of information regarding distance, can be obtained with the following equation (1).

$$tTOF = \text{ranging count value/frequency of clock signal CLK} \quad (1)$$

The distance D to the subject can be obtained with the following equation (2), based on the time of flight of light tTOF and the speed of light c. The speed of light c is 299792458 m/s.

$$D = c \times tTOF/2 \quad (2)$$

The round-trip time of light is 0.333 ns per meter, which is extremely short. For this reason, the frequency of the clock signal CLK for obtaining sufficient time resolution exceeds 1 GHz, for example. Note that, even if a clock signal CLK of such a high frequency is not used, for example, time resolution can be improved by using a time-to-digital converter (TDC) that converts time based on a High/Low state of a plurality of clock signals with different phases. The TDC can be provided in the counter 114, for example. According to this embodiment, the distance to a subject can be quickly obtained based on the time of flight of light tTOF.

Thus, in this embodiment, the counter 114 can be switched between an imaging mode and a ranging mode for obtaining the information regarding distance, by switching the signal to be input to the input terminal of the counter 114. Note that the LPF 119, the comparator 120, and the light emitting unit 409 need to be caused to operate when in the ranging mode, but do not need to be caused to operate when in the imaging mode. For this reason, in the imaging mode, power consumption may be reduced by restricting the current provided to the LPF 119, the comparator 120, and the light emitting unit 409.

A control pulse MEM, which is generated by the timing generator 102, is provided to the transfer switch 121. The control pulse MEM is provided to the transfer switches 121 provided in all pixels 110 at the same timing. The transfer switch 121 enters the ON state when the control pulse MEM is switched to the High level. Upon the transfer switch 121 entering the ON state, the count value of the counter 114 is transferred to the pixel memory 116. The pixel memory 116 temporarily stores the count value provided from the counter 114. By causing the readout switch 122 to enter the ON state, the count value stored in the pixel memory 116 is written in the column memory 103 via a signal line 105.

A plurality of control lines that extends in the horizontal direction are connected to the vertical scan unit 101. The vertical scan unit 101 sequentially provides a readout signal (readout pulse) READ to these control lines. A sign READ is used to describe readout signals in general, and signs READn and READn+1 are used to describe individual readout signals. The readout signal READn is a readout signal that is applied to a control line located in an $n^{th}$ row. The readout signal READn+1 is a readout signal that is applied to a control line located in an $n+1^{th}$ row. The readout signal READ is provided to a plurality of pixels 110 located in the same row, via the same control line. The readout signal READ is provided to the readout switch 122. The readout switch 122 enters the ON state when the readout signal READn is switched to the High level.

A plurality of signal lines (vertical signal lines, output signal lines) 105 that extend in the vertical direction are connected to the column memory 103. Note that a reference numeral 105 is used to describe signal lines in general, and reference numerals 105a and 105b are used to describe individual signal lines. Although two signal lines 105 are shown here to simplify the description, a signal line 105 is provided for each column, and a large number of signal lines 105 are provided in the solid-state image sensor 100. A signal output from the pixel memory 116 is output to the column memory 103 via the readout switch 122, the output unit 125, and the signal line 105. The readout switch 122 is in the OFF state when the readout signal READ provided from the vertical scan unit 101 is at the Low level, and is in the ON state when the readout signal READ is at the High level. Signal values, i.e. pixel signal values (count values) output from respective pixels 110 located in a row that is selected by means of the readout signal READ provided from the vertical scan unit 101, are written in the column memory 103 via the signal lines 105. The column memory 103 holds the pixel signal values read out from respective pixels 110.

A signal that is obtained by the delay circuit 124 delaying the readout signal READ is provided to the reset terminal of the pixel memory 116. The delay circuit 124 is configured by connecting two inverters in series, for example. After the signal output from the pixel memory 116 has been stored in the column memory 103 via the readout switch 122, the pixel memory 116 is reset by the signal provided from the delay circuit 124.

The horizontal scan unit 104 sequentially outputs the pixel signal values held by the column memory 103 to the signal processing unit 402 (see FIGS. 4A to 4C) via an output line Output.

Figure 2:
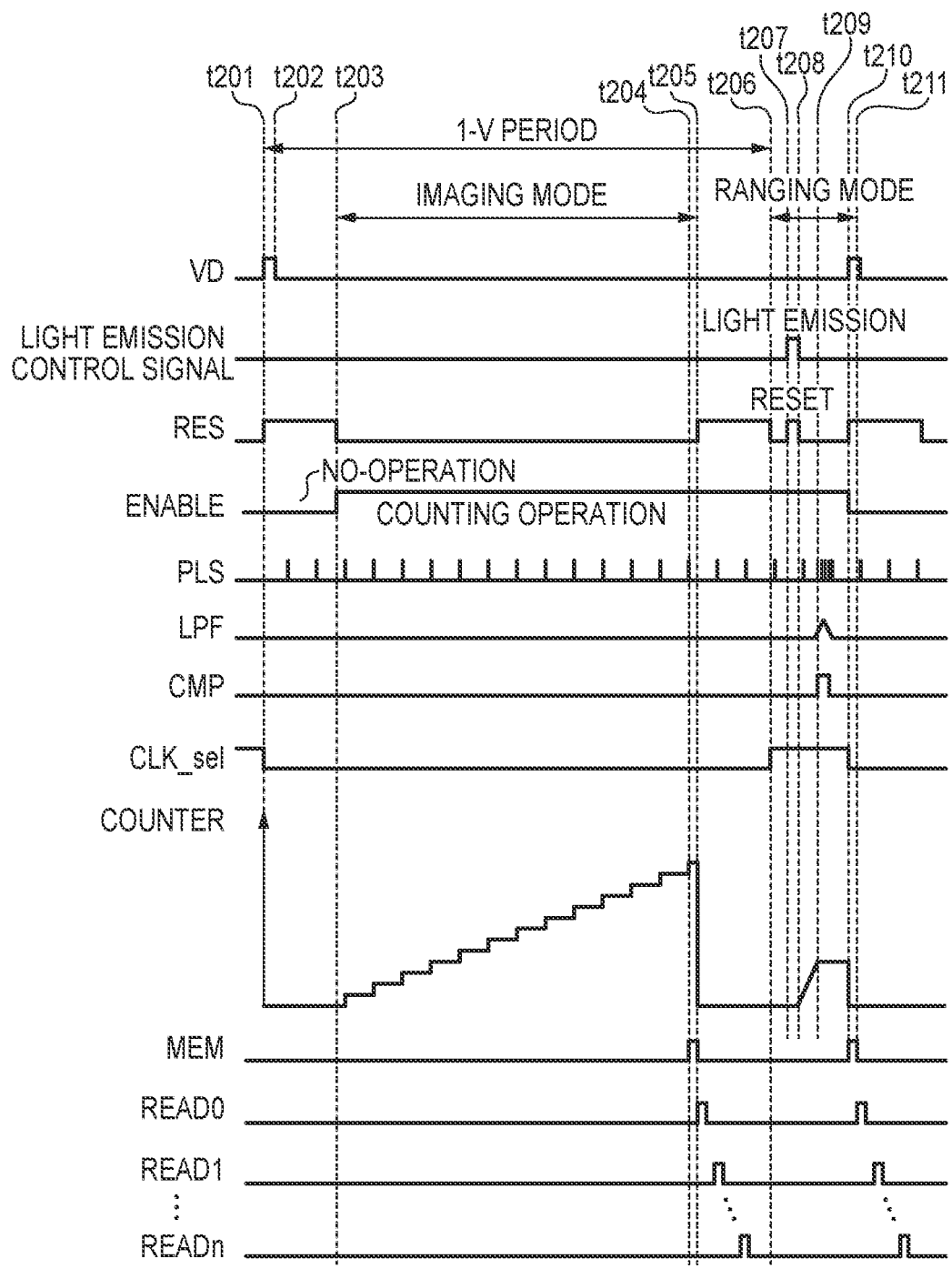
FIG. 2 is a timing chart illustrating an operation of the solid-state image sensor according to the first embodiment.

FIG. 2 is a timing chart illustrating an operation of the solid-state image sensor 100 according to this embodiment. The following description focuses on the operation of the pixel 110a, out of the plurality of pixels 110. The period from timing t201 to timing t206 is a 1-V period, which is a period that corresponds to a cycle of the synchronizing signal VD. The period from timing t201 to timing t211 is a one-frame period, which is the period of one frame. The period from timing t203 to timing t205 is a period in which the pixels 110 operate in the imaging mode. The period from timing t206 to timing t211 is a period in which the pixels 110 operate in the ranging mode.

At the timing t201, upon the synchronizing signal (synchronizing pulse) VD being switched to the High level, the timing generator 102 sets the reset signal RES to the High level. Thus, the counter 114 and the SR latch circuit 123 in each pixel 110 are reset. Note that the synchronizing signal VD is restored to the Low level at timing t202.

At timing t203, the timing generator 102 sets the reset signal RES to the Low level, and sets the enable signal ENABLE to the High level. Upon the reset signal RES being switched to the Low level, the reset of the counter 114 is released, and, upon the enable signal ENABLE being switched to the High level, the counter 114 starts counting the pulse signal PLS output from the inverter 113. Thus, an operation in the imaging mode is started. The period from timing t203 to timing t205 is a period in which operation is performed in the imaging mode. In this period, upon a single photon being incident on the SPAD 111, a signal is generated by the SPAD 111, and a pulse signal PLS whose waveform has been shaped is output from the inverter 113, as described above using FIG. 1. The counter 114 counts the number of pulses of the pulse signal PLS output from the inverter 113.

At timing t204, which is a timing immediately before timing t205, the control pulse MEM is switched to the High level. Upon the control pulse MEM being switched to the High level, the transfer switch 121 enters the ON state, and the count value of the counter 114 is stored in the pixel memory 116. Accordingly, the number of pulses of the pulse signal PLS that is counted from timing t203 until timing t204 serves the imaging count value.

In the period from timing t205 until timing t206, pixel signal values held by the column memory 103 are sequentially output to the signal processing unit 402 via the output line Output. Specifically, at timing t205, a readout signal READ0 provided from the vertical scan unit 101 to a plurality of pixels 110 located in a zero$^{th}$ row is switched to the High level. Upon the readout signal READ0 being switched to the High level, the imaging count values acquired by the respective pixels 110 located in the zero$^{th}$ row are written in the column memory 103. Thereafter, a signal obtained by the delay circuit 124 delaying the readout signal READ0 is provided to the reset terminal of the pixel memory 116, and thus the pixel memory 116 is reset. The horizontal scan unit 104 sequentially outputs the pixel signal values that are acquired by the plurality of pixels 110 located in the zero$^{th}$ row and stored in the column memory 103, to the signal processing unit 402 via the output line Output. Thus, readout of the imaging count values from the plurality of pixels 110 located in the zero$^{th}$ row is complete. Thereafter, similarly, the imaging count values are sequentially read out from a plurality of pixels 110 located in the respective rows. Thus, the imaging count values are read out from all rows, and readout of the imaging count values for one frame is complete.

The period from timing t206 to timing t211 is a period in which operation is performed in the ranging mode. In the period from timing t206 to timing t210, the control signal CLK_sel is set to the High level, and the clock signal CLK is input to the input terminal of the counter 114.

In the period from timing t207 to timing t208, a light emission control signal for causing the light emitting unit 409 to emit light is set to the High level, and the reset signal RES is set to the High level. As a result, the counter 114 by which the imaging count values are held is reset.

Thereafter, light reflected off a subject reaches an imaging plane of the solid-state image sensor 100. Upon the light reflected off the subject reaching the imaging plane of the solid-state image sensor 100, the time interval between pulses of the pulse signal PLS narrows. If the time interval between pulses of the pulse signal PLS narrows, the voltage of the signal output from the LPF 119 increases. At timing t209, the voltage of the signal output from the LPF 119 becomes greater than or equal to the first threshold Vth1, and a High-level signal is output from the comparator 120. Since the control signal CLK_sel is at the High level, upon a High-level signal being output from the comparator 120, the signal output from the NAND element 117 is switched to the Low level. Upon the signal output from the NAND element 117 being switched to the Low level, the signal output from the AND element 118 is switched to the Low level, and the enable terminal of the counter 114 is switched to the Low level. The time difference between timing t207 and timing t209 is proportional to the distance to the subject. A ranging count value that is based on the time difference between timing t207 and timing t209 is acquired by the counter 114.

In the period from timing t210 to timing t211, the control pulse MEM is at the High level. Upon the control pulse MEM being switched to the High level, the transfer switch 121 enters the ON state, and the count value of the counter 114 is stored in the pixel memory 116. Accordingly, the number of pulses of the pulse signal PLS that is counted from timing t207 until timing t209 serves the ranging count value.

From timing t211 onward, pixel signal values are sequentially read out from respective rows. Ranging count values are sequentially read out from a plurality of pixels 110 located in respective rows. Thus, the ranging count values are read out from all rows, and readout of the ranging count values for one frame is complete.

Note that the synchronizing signal VD may be set to the High level at timing t210, and shooting for the next frame of the current frame may be started. If the subject distance obtained based on the ranging count values has changed, the focus position of an optical system (imaging optical system) 401 (see FIGS. 4A to 4C) may be adjusted before the shooting for the next frame. In addition, since a detection delay that is based on the value of the first threshold Vth1 may occur in the comparator 120, correction may be performed based on the value of the first threshold Vth1 when obtaining the distance to the subject based on the ranging count value.

In the solid-state image sensor 100 according to this embodiment, many bits of data is held by a counting unit 304 that includes the counter 114 and the pixel memory 116, and thus, the circuit scale of the solid-state image sensor 100 tends to be large. However, since the counting operation in the imaging mode and the counting operation in the ranging mode can be performed using the same counting unit 304, an excessive increase in the circuit scale can be suppressed.

Figure 3A:
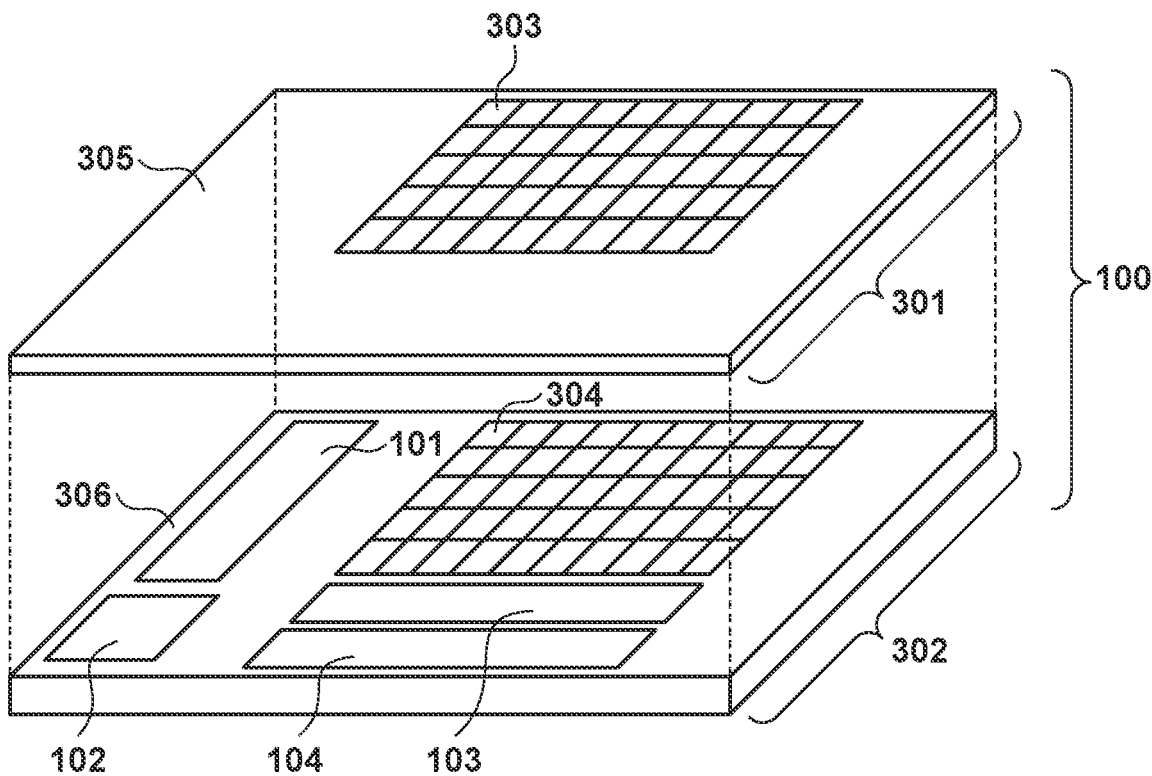
FIGS. 3A and 3B show the solid-state image sensor according to the first embodiment.
Figure 3B:
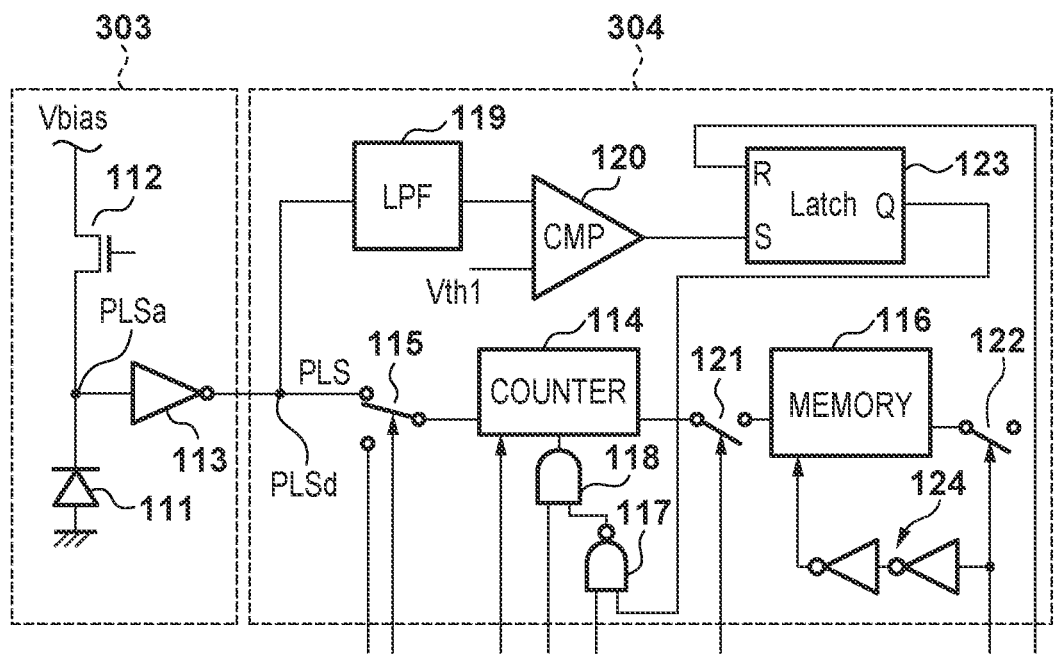

FIGS. 3A and 3B illustrate the solid-state image sensor according to this embodiment. FIG. 3A is a perspective diagram of the solid-state image sensor according to this embodiment. As shown in FIG. 3A, the solid-state image sensor 100 is configured by stacking two substrates (semiconductor chips) 301 and 302. FIG. 3B illustrate a pixel provided in the solid-state image sensor 100 according to this embodiment. FIG. 3B shows one pixel 110 that is extracted from among the plurality of pixels 110 provided in the solid-state image sensor 100.

As shown in FIG. 3A, the solid-state image sensor 100 is constituted by a substrate (upper substrate) 301 for receiving an optical image formed by the optical system 401, and a substrate (lower substrate) 302 that mainly includes a digital circuit. As shown in FIG. 3B, each pixel 110 is constituted by the sensor unit (light receiving unit, pixel unit) 303 and the counting unit 304. The sensor unit 303 in the pixel 110 is formed on the substrate 301. The counting unit 304 in the pixel 110 is formed on the substrate 302. A plurality of sensor units 303 are arranged in a matrix on the substrate 301. A plurality of counting units 304 are arranged in a matrix on the substrate 302. Each sensor unit 303 and a corresponding one of the counting units 304 are electrically connected to each other. Thus, the plurality of pixels 110 are arranged in a matrix.

Each sensor unit 303 is provided with the SPAD 111, the quenching element 112, and the inverter 113. Since the inverter 113 is provided in the sensor unit 303, a pulse signal PLS whose waveform has been shaped is transmitted from the sensor unit 303 to the counting unit 304. Accordingly, transmission from the sensor unit 303 to the counting unit 304 is relatively robust. The counting unit 304 is provided with the input selection switch 115, the counter 114, the transfer switch 121, the pixel memory 116, the NAND element 117, the AND element 118, the LPF 119, the comparator 120, and the readout switch 122. The counting unit 304 is also provided with the SR latch circuit 123 and the delay circuit 124.

The vertical scan unit 101, the timing generator 102, the column memory 103, and the horizontal scan unit 104 are provided in either a peripheral circuit portion 305 of the substrate 301 or a peripheral circuit portion 306 of the substrate 302. The following description takes, as an example, a case where the vertical scan unit 101, the timing generator 102, the column memory 103, and the horizontal scan unit 104 are arranged in the peripheral circuit portion 306 of the substrate 302.

Thus, in this embodiment, the sensor units 303 are formed on the substrate 301, and the counting units 304 are formed on the substrate 302. Since the counting units 304 with a large circuit scale are provided on the substrate 302, which is different from the substrate 301 on which the sensor units 303 are provided, the area for the sensor units 303 can be secured sufficiently. Accordingly, the opening area for the sensor units 303 can be secured sufficiently.

Note that the structure of the solid-state image sensor 100 is not limited to the above-described structure. The structure of the solid-state image sensor 100 can be changed as appropriate, in accordance with the purpose and application.

For example, the solid-state image sensor 100 may be configured by stacking three or more substrates, or the solid-state image sensor 100 may be constituted by one substrate. The respective substrates (semiconductor chips) may be manufactured according to different manufacturing processes. Another circuit, a frame memory, or the like for performing signal processing may also be provided on the substrate 302. For example, a signal processing circuit for performing noise reduction processing, a detection circuit for detecting a subject that is subjected to image capture, or the like may also be provided on the substrate 302.

FIG. 4A is a block diagram illustrating an image capture apparatus 400 according to this embodiment. The image capture apparatus 400 includes the solid-state image sensor 100, the signal processing unit 402, a memory 403, the control unit 404, an operation unit 405, a display unit 406, a recording unit 407, an optical system driving unit 408, and the light emitting unit 409. The image capture apparatus 400 is provided with an optical system 401. The optical system 401 may be or may not be removable from the image capture apparatus 400.

The optical system 401 is provided with a focusing lens, a zoom lens, a diaphragm, and so on. The optical system 401 forms an optical image of a subject, and causes the formed optical image to be incident on the imaging plane of the solid-state image sensor 100. The solid-state image sensor 100 captures the optical image formed by the optical system 401 as described above. The solid-state image sensor 100 sequentially reads out pixel signal values from the plurality of pixels 110, and sequentially outputs the read pixel signal values to the signal processing unit 402. The imaging count values are output from the solid-state image sensor 100 when in the imaging mode, and the ranging count values are output from the solid-state image sensor 100 when in the ranging mode.

The signal processing unit 402 sequentially processes the imaging count values or the ranging count values output from the solid-state image sensor 100. For example, the signal processing unit 402 can acquire a range map, which is two-dimensional range data, by calculating the distance to each subject based on the above equations (1) and (2). The signal processing unit 402 can also perform correction processing or the like on the imaging count values. Thus, an image, i.e. image data is generated. This image may be a still image, or may be a frame that constitutes a moving image. The signal processing unit 402 can also perform signal rearrangement, correction of defective pixels, noise reduction, color conversion, white balance correction, gamma correction, resolution conversion, data compression, or the like, in the process of generating an image.

The memory 403 is used when the signal processing unit 402 performs computing processing or the like. A DRAM (Dynamic Random Access Memory), a flash memory, or the like can be used as the memory 403, for example. The memory 403 can also be used as a buffer memory during continuous shooting.

The control unit (overall control and computing unit) 404 governs overall control of the image capture apparatus 400 according to this embodiment. The control unit 404 is provided with a CPU (Central Processing Unit), and so on. The control unit 404 outputs an image signal processed by the signal processing unit 402 to the memory 403 and the display unit 406. The control unit 404 provides a still image or a moving image provided from the signal processing unit 402 to the recording unit 407 and the display unit 406.

The operation unit 405 is constituted by operation members such as buttons, switches, and an electronic dial. Upon a user or the like operating the operation unit 405, a signal that is based on the content of operation is provided from the operation unit 405 to the control unit 404. The display unit 406 displays an image provided from the control unit 404. A recording medium (not shown) is attached to the recording unit (recording control unit) 407. A memory card or the like is used as this recording medium, for example. Note that a hard disk or the like may be used as the recording medium. The optical system driving unit 408 is for controlling the focusing lens, zoom lens, diaphragm, and so on that are provided in the optical system 401.

The control unit 404 performs autofocus processing by driving the focusing lens provided in the optical system 401 by means of the optical system driving unit 408, based on the range map provided from the signal processing unit 402 and the ranging mode that is set in advance. Examples of the ranging mode include center-weighted distance measurement and main subject-weighted distance measurement, but the present invention is not limited thereto.

Note that the image capture apparatus 400 may further include a wired or wireless communication interface for communicating with an external apparatus. In this case, the image capture apparatus 400 can transmit a generated image or the like to an external apparatus or the like, and receive a control signal or the like from the external apparatus, via this communication interface.

The light emitting unit 409 is a light source that is used in the ranging mode. The light emitting unit 409 emits light in a visible light range, for example. The light emitting unit 409 starts emitting light if the light emission control signal provided from the control unit 404 is switched to the High level, and ends emitting light if this light emission control signal is switched to the Low level.

Thus, according to this embodiment, the counter 114 can operate in a first mode of counting the number of pulses of the pulse signal PLS generated by the sensor unit 303. The counter 114 can also operate in a second mode of counting the number of pulses of the clock signal CLK that is based on the elapsed time since the timing at which light was emitted from the light emitting unit 409. Thus, this embodiment can provide a solid-state image sensor and an image capture apparatus that can realize image acquisition and distance measurement while restraining the circuit scale from increasing.

Second Embodiment

A solid-state image sensor and an image capture apparatus according to the second embodiment will be described with reference to FIGS. 4B, 5, and 6. The same constituent elements as those of the solid-state image sensor and so on according to the first embodiment shown in FIGS. 1 to 4A are assigned the same reference numerals, and are not described or are briefly described.

A solid-state image sensor 500 according to this embodiment can cause G pixels 110b and 110c to operate in the imaging mode while causing R pixels 110a and B pixels 110d to operate in the ranging mode. The solid-state image sensor 500 according to this embodiment can also cause the G pixels 110b and 110c to operate in the ranging mode while operating the R pixels 110a and the B pixels 110d in the imaging mode.

FIG. 4B is a block diagram illustrating an image capture apparatus 400 according to this embodiment. As shown in FIG. 4B, the light emitting unit 409 includes an R light emitting unit 409R for emitting light with a wavelength that corresponds to R (red), a G light emitting unit 409G for emitting light with a wavelength that corresponds to G (green), and a B light emitting unit 409B for emitting light with a wavelength that corresponds to B (blue). The light emission wavelength of the R light emitting unit 409R is at a level of 600 nm, for example. The light emission wavelength of the G light emitting unit 409G is at a level of 500 nm, for example. The light emission wavelength of the B light emitting unit 409B is at a level of 400 nm, for example.

Figure 5:
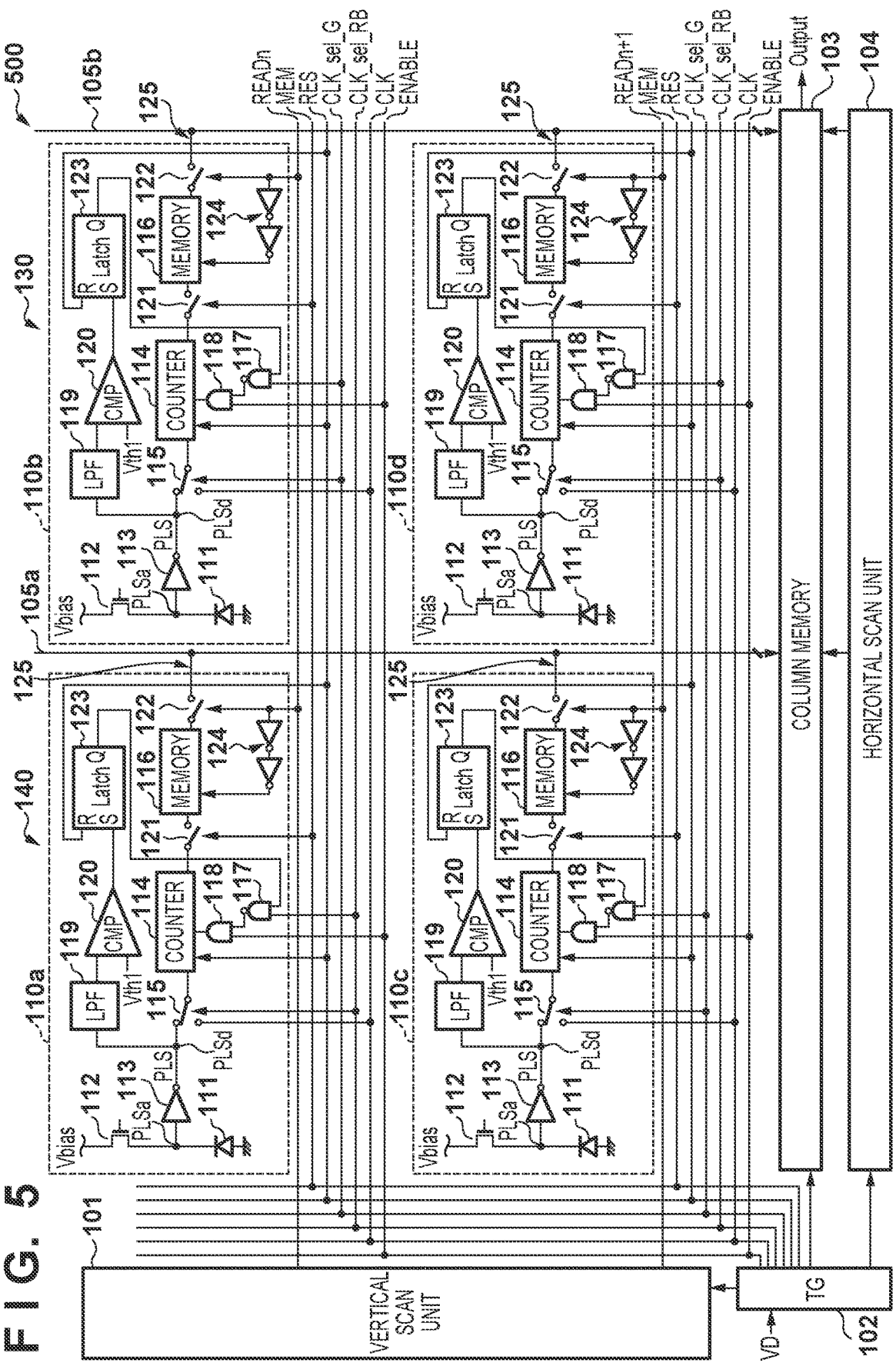
FIG. 5 illustrates a solid-state image sensor according to a second embodiment.

FIG. 5 illustrates the solid-state image sensor 500 according to this embodiment. Each pixel 110a is an R pixel that is provided with a color filter with a transmitted wavelength range of R, and each of the pixels 110b and 110c is a G pixel that is provided with color filters with a transmitted wavelength range of G. Each pixel 110d is a B pixel that is provided with a color filter with a transmitted wavelength range of B. Thus, pixels 110 arranged in a Bayer array are provided in the pixel array of the solid-state image sensor 500. The solid-state image sensor 500 is provided with an interconnect for providing a control signal CLK_sel_G to the pixels 110 from the timing generator 102, and an interconnect for providing a control signal CLK_sel_RB to the pixels 110 from the timing generator 102. The control signal CLK_sel_RB is provided to the input selection switch 115 that is included in each of the R pixels 110a and the B pixels 110d. The control signal CLK_sel_RB is also provided to one input terminal of the NAND element 117 that is included in each of the R pixels 110a and the B pixels 110d. The control signal CLK_sel_G is provided to the input selection switch 115 that is included in each of the G pixels 110b and 110c that are G pixels. The control signal CLK_sel_G is also provided to one input terminal of the NAND element 117 that is included in each of the G pixels 110b and 110c.

Figure 6:
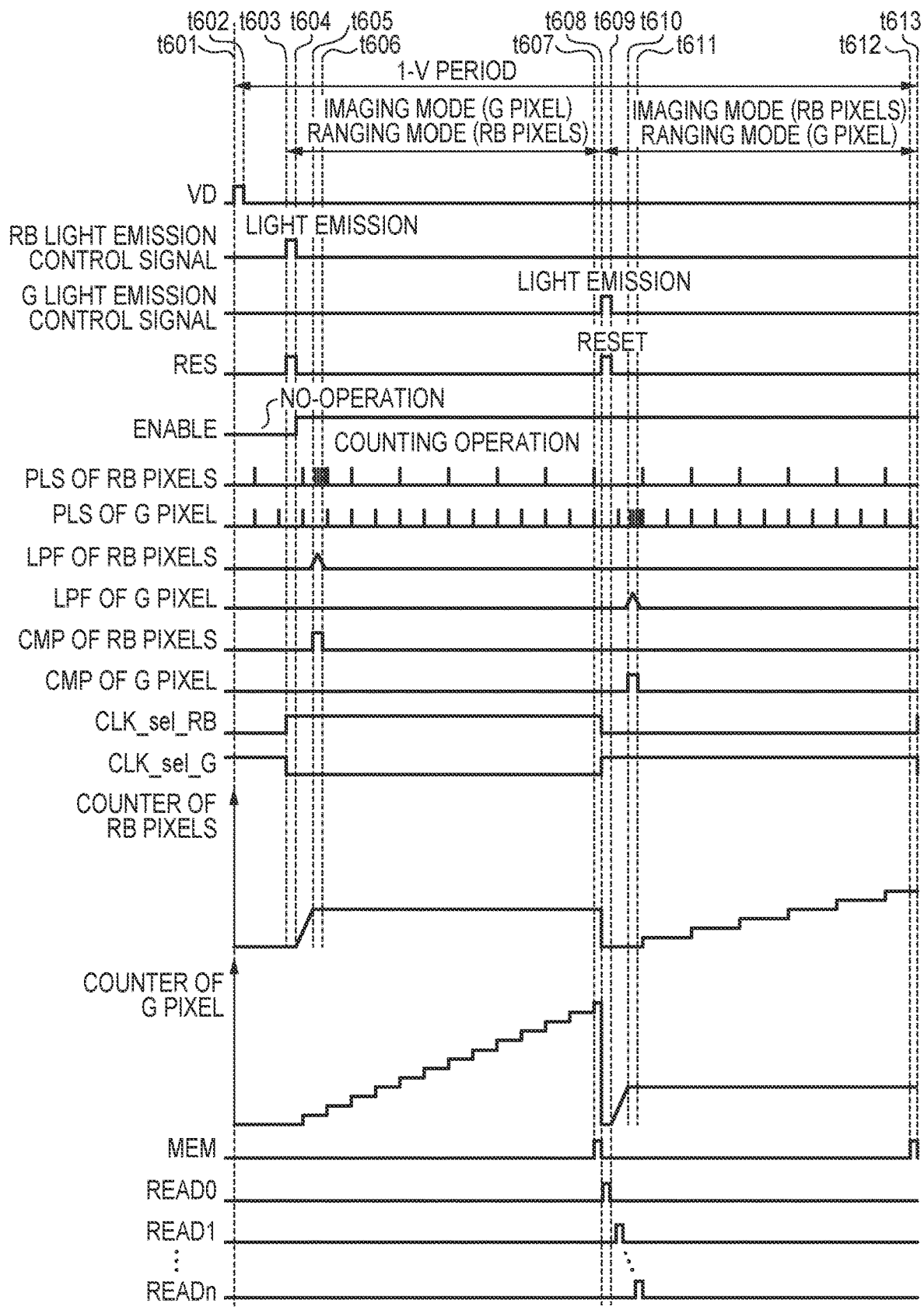
FIG. 6 is a timing chart illustrating an operation of the solid-state image sensor according to the second embodiment.

FIG. 6 is a timing chart illustrating an operation of the solid-state image sensor 500 according to this embodiment. The period from timing t601 to timing t613 is a 1-V period, which is a period that corresponds to a cycle of the synchronizing signal VD. The period from timing t603 to timing t608 is a period of operating the G pixels 110b and 110c in the imaging mode, and operating the R pixels 110a and the B pixels 110d in the ranging mode. The period from timing t608 to timing t613 is a period of operating the R pixels 110a and the B pixels 110d in the imaging mode, and operating the G pixels 110b and 110c in the ranging mode.

At timing t601, the synchronizing signal VD is switched to the High level. At timing t602, the synchronizing signal VD is restored to the Low level.

At timing t603, the control unit 404 sets, to the High level, the R light emission control signal for causing the R light emitting unit 409R to emit light, and the B light emission control signal for causing the B light emitting unit 409B to emit light. Thus, the R light emitting unit 409R and the B light emitting unit 409B start emitting light. Also, at timing t603, the timing generator 102 sets the reset signal RES to the High level. Thus, the counter 114 and the SR latch circuit 123 in each pixel 110 are reset. Also, at timing t603, the timing generator 102 changes the control signal CLK_sel_RB from the Low level to the High level. Thus, in the R pixels 110a and the B pixels 110d, the input selection switch 115 is set so that the clock signal CLK is input to the input terminal of the counter 114. As a result, the R pixels 110a and the B pixels 110d can operate in the ranging mode. Also, at timing t603, the timing generator 102 changes the control signal CLK_sel_G from the High level to the Low level. Thus, in the G pixels 110b and 110c, the input selection switch 115 is set so that the pulse signal PLS output from the inverter 113 is input to the input terminal of the counter 114. As a result, the G pixels 110b and 110c can operate in the imaging mode.

At timing t604, the control unit 404 sets, to the Low level, the R light emission control signal for causing the R light emitting unit 409R to emit light, and the B light emission control signal for causing the B light emitting unit 409B to emit light. Thus, the R light emitting unit 409R and the B light emitting unit 409B stop emitting light. Also, at timing t604, the timing generator 102 sets the reset signal RES to the Low level, and sets the enable signal ENABLE to the High level. The reset of the counter 114 is released upon the reset signal RES being switched to the Low level, and the counter 114 starts the counting operation upon the enable signal ENABLE being switched to the High level. Light emitted from the R light emitting unit 409R and the B light emitting unit 409B is reflected off a subject, and the reflected light reaches the pixels 110 arranged on the imaging plane of the solid-state image sensor 500. Upon the light reflected off the subject reaching the pixels 110 arranged on the imaging plane of the solid-state image sensor 500, the time interval between pulses of the pulse signal PLS narrows in the R pixels 110a and the B pixels 110d. Upon the time interval between pulses of the pulse signal PLS narrowing in the R pixels 110a and the B pixels 110d, the voltage of the signal output from the LPF 119 provided in each of the R pixels 110a and the B pixels 110d increases. Then, the voltage of the signal output from the LPF 119 provided in an R pixel 110a and a B pixel 110d becomes greater than or equal to the first threshold Vth1 at timing t605. As a result, the level of the signal output from the comparator 120 provided in each of the R pixels 110a and the B pixels 110d is inverted to the High level. The time difference between timing t603 and timing t605 is proportional to the distance to the subject. The control signal CLK_sel_RB is at the High level. For this reason, upon the level of the signal output from the comparator 120 provided in each of the R pixels 110a and the B pixels 110d being inverted to the High level, the signal output from the NAND element 117 provided in each of the R pixels 110a and the B pixels 110d is switched to the Low level. Upon the signal output from the NAND element 117 provided in each of the R pixels 110a and the B pixels 110d being switched to the Low level, the signal output from the AND element 118 provided in each of the R pixels 110a and the B pixels 110d is switched to the Low level. Also, upon the signal output from the NAND element 117 provided in each of the R pixels 110a and the B pixels 110d being switched to the Low level, the enable terminal of the counter 114 provided in each of the R pixels 110a and the B pixels 110d is switched to the Low level. Thus, the ranging count value that is based on the time difference between timing t603 and timing t605 is acquired by the counter 114 provided in each of the R pixels 110a and the B pixels 110d. Note that the signal output from the comparator 120 provided in each of the R pixels 110a and the B pixels 110d is switched to the Low level at timing t606. On the other hand, in the G pixels 110b and 110c, at timing t604, the counter 114 starts counting the pulse signal PLS output from the inverter 113. Upon a photon being incident on the SPAD 111 provided in each of the G pixels 110b and 110c, a signal is generated by this SPAD 111, and a pulse signal PLS whose waveform has been shaped is output from the inverter 113. The counter 114 provided in each of the G pixels 110b and 110c counts the number of pulses of the pulse signal PLS output from the inverter 113 provided therein.

At timing t607, which is a timing immediately before timing t608, the control pulse MEM is switched to the High level. Upon the control pulse MEM being switched to the High level, the transfer switch 121 enters the ON state, and the count value of the counter 114 is stored in the pixel memory 116. Accordingly, the count values obtained by the counters 114 provided in the R pixels 110a and the B pixels 110d serve as the ranging count values of the respective R pixels 110a and B pixels 110d. Also, the count values obtained by the counters 114 provided in the G pixels 110b and 110c serve as the imaging count values of the respective G pixels 110b and 110c.

At timing t608, the control unit 404 sets the G light emission control signal for causing the G light emitting unit 409G to emit light to the High level. Thus, the G light emitting unit 409G starts emitting light. Also, at timing t608, the timing generator 102 sets the reset signal RES to the High level. Thus, the counter 114 and the SR latch circuit 123 in each pixel 110 are reset. Also, at timing t608, the timing generator 102 changes the control signal CLK_sel_RB from the High level to the Low level. Thus, in the R pixels 110a and the B pixels 110d, the input selection switch 115 is set so that the pulse signal PLS output from the inverter 113 is input to the input terminal of the counter 114. As a result, the R pixels 110a and the B pixels 110d can operate in the imaging mode. Also, at timing t608, the timing generator 102 changes the control signal CLK_sel_G from the Low level to the High level. Thus, in the G pixels 110b and 110c, the input selection switch 115 is set so that clock signal CLK is input to the input terminal of the counter 114. As a result, the G pixels 110b and 110c can operate in the ranging mode.

From timing t608 onward, pixel signal values are sequentially read out from respective rows. The ranging count values are read out from the R pixels 110a and the B pixels 110d, and the imaging count values are read out from the G pixels 110b and 110c. Thus, these count values are read out from all rows.

At timing t609, the control unit 404 sets the G light emission control signal for causing the G light emitting unit 409G to emit light to the Low level. Thus, the G light emitting unit 409G stops emitting light. Also, at timing t609, the timing generator 102 sets the reset signal RES to the Low level. Upon the reset signal RES being switched to the Low level, the reset of the counter 114 is released, and the counter 114 starts the counting operation. Light emitted from the G light emitting unit 409G is reflected off the subject, and the reflected light reaches the pixels 110 arranged on the imaging plane of the solid-state image sensor 500. Upon the light reflected off the subject reaching the imaging plane of the solid-state image sensor 500, the time interval between pulses of the pulse signal PLS narrows in the G pixels 110b and 110c. Upon the time interval between pulses of the pulse signal PLS narrowing in the G pixels 110b and 110c, the voltage of the signal output from the LPF 119 provided in each of the G pixels 110b and 110c increases. Then, the voltage of the signal output from the LPF 119 provided in G pixels 110b and 110c becomes greater than or equal to the first threshold Vth1 at timing t610. As a result, the signal output from the comparator 120 provided in each of the G pixels 110b and 110c is switched to the High level. The time difference between timing t608 and timing t610 is proportional to the distance to the subject. The control signal CLK_sel_G is at the High level. For this reason, upon the High-level signal being output from the comparator 120 provided in each of the G pixels 110b and 110c, the signal output from the NAND element 117 provided in each of the G pixels 110b and 110c is switched to the Low level. Upon the signal output from the NAND element 117 provided in each of the G pixels 110b and 110c being switched to the Low level, the signal output from the AND element 118 provided in each of the G pixels 110b and 110c is switched to the Low level. Also, upon the signal output from the NAND element 117 provided in each of the G pixels 110b and 110c being switched to the Low level, the enable terminal of the counter 114 provided in each of the G pixels 110b and 110c is switched to the Low level. Thus, the ranging count value that is based on the time difference between timing t608 and timing t610 is acquired by the counter 114 provided in each of the G pixels 110b and 110c. Note that the signal output from the comparator 120 provided in each of the G pixels 110b and 110c is switched to the Low level at timing t611. On the other hand, in the R pixels 110a and the B pixels 110d, at timing t609, the counter 114 starts counting the pulse signal PLS output from the inverter 113. Upon a photon being incident on the SPAD 111 provided in each of the R pixels 110a and the B pixels 110d, a signal is generated by this SPAD 111, and a pulse signal PLS whose waveform has been shaped is output from the inverter 113. The counter 114 provided in each of the R pixels 110a and the B pixels 110d counts the number of pulses of the pulse signal PLS output from the inverter 113 provided therein.

At timing t612, which is a timing immediately before timing t613, the control pulse MEM is switched to the High level. Upon the control pulse MEM being switched to the High level, the transfer switch 121 enters the ON state, and the count value of the counter 114 is stored in the pixel memory 116. Accordingly, the count values obtained by the counters 114 provided in the R pixels 110a and the B pixels 110d serve as the imaging count value of the respective R pixels 110a and B pixels 110d. Also, the count values obtained by the counters 114 provided in the G pixels 110b and 110c serve as the ranging count values of the respective G pixels 110b and 110c.

From timing t613 onward, pixel signal values are sequentially read out from respective rows. The imaging count values are read out from the R pixels 110a and the B pixels 110d, and the ranging count values are read out from the G pixels 110b and 110c. Thus, these count values are read out from all rows.

As described above, according to this embodiment, the G pixels 110b and 110c are caused to operate in the imaging mode while causing the R pixels 110a and the B pixels 110d to operate in the ranging mode. On the other hand, the G pixels 110b and 110c are caused to operate in the ranging mode while causing the R pixels 110a and the B pixels 110d to operate in the imaging mode. Thus, according to this embodiment, the operation in the ranging mode and the operation in the imaging mode can be executed in parallel.

Third Embodiment

A solid-state image sensor and an image capture apparatus according to the third embodiment will be described with reference to FIGS. 4C and 7 to 11. The same constituent elements as those of the solid-state image sensor and so on according to the first or second embodiment shown in FIGS. 1 to 6 are assigned the same reference numerals, and are not described or are briefly described.

The solid-state image sensor according to this embodiment is provided with a pixel 810c capable of detecting infrared light.

FIG. 4C is a block diagram illustrating an image capture apparatus 400 according to this embodiment. As shown in FIG. 4C, the image capture apparatus 400 according to this embodiment is provided with an infrared light emitting unit 40918 for emitting infrared light.

FIG. 7 conceptually illustrates respective areas of a pixel array 830 provided in the solid-state image sensor 800 according to this embodiment. As shown in FIG. 7, the pixel array 830 includes a plurality of areas Area (p, q). A plurality of unit pixels 840 (see FIG. 8) are formed in one area Area (p, q). Each unit pixel 840 includes four pixels 810a to 810d (see FIG. 8), which are arranged as an array of two rows by two columns. Although FIG. 7 shows, as an example, a case were the pixel array 830 is divided into 64 areas Area (p, q), the invention is not limited thereto.

Figure 8:
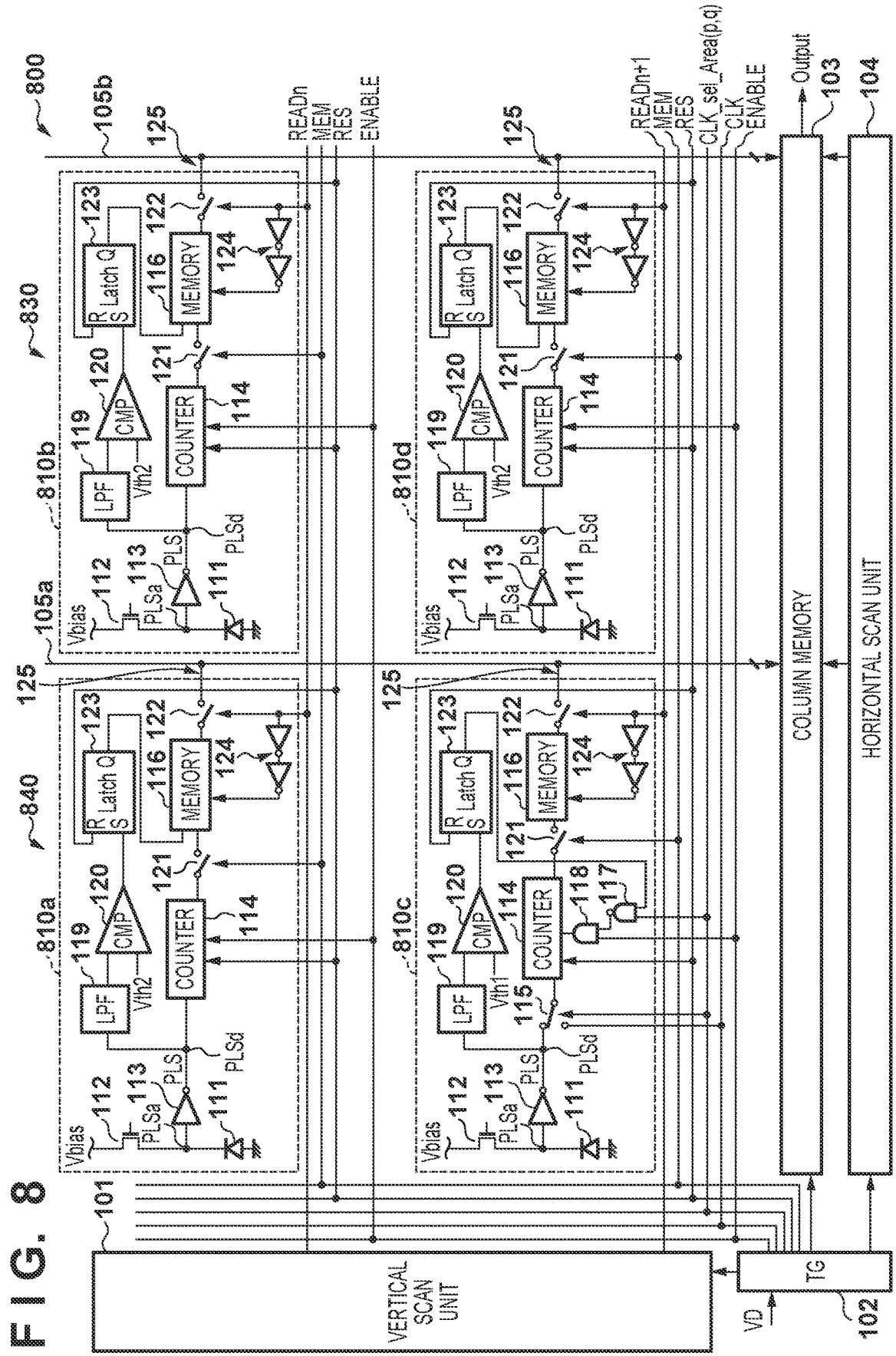
FIG. 8 illustrates a solid-state image sensor according to the third embodiment.

FIG. 8 illustrates the solid-state image sensor 800 according to this embodiment. The solid-state image sensor 800 is provided with a plurality of unit pixels 840, each including a plurality of pixels 810. FIG. 8 shows one unit pixel 840, out of the plurality of unit pixels 840 provided in the pixel array 830. As mentioned above, one unit pixel 840 includes four pixels 810. A reference numeral 810 is used to describe pixels in general, and reference numerals 810a to 810d are used to describe individual pixels. The configuration of the pixel 810c is the same as the configuration of the pixel 110c provided in the solid-state image sensor 100 according to the first embodiment described above using FIG. 1. A control signal CLK_sel_Area(p, q) is provided to the pixel 810c located in an area Area(p, q). The Control signal CLK_sel_Area(p, q) is not provided to the pixels 810a, 810b, and 810d.

The input selection switch 115 is not provided in the pixels 810a, 810b, and 810d. For this reason, only the pulse signal PLS output from the inverter 113 is input to the input terminal of the counter 114 provided in each of the pixels 810a, 810b, and 810d. Accordingly, the pixels 810a, 810b, and 810d only operate in the imaging mode. Also, the pixels 810a, 810b, and 810d are not provided with the AND element 118 and the NAND element 117. For this reason, whether or not to enable the counter 114 provided in each of the pixels 810a, 810b, and 810d is only controlled by the enable signal ENABLE. Also, in the pixels 810a, 810b, and 810d, the signal output from the Q terminal of the SR latch circuit 123 is provided to the pixel memory 116, together with the count value provided from the counter 114. Similarly to the comparator 120 provided in the pixel 810c, one input terminal of the comparator 120 provided in each of the pixels 810a, 810b, and 810d receives the signal output from the LPF 119. A second threshold Vth2, which differs from the first threshold Vth1, is provided to the other input terminal of the comparator 120 provided in each of the pixels 810a, 810b, and 810d. In the pixels 810a, 810b, and 810d, a Low-level signal is output from the comparator 120 when the output voltage of the LPF 119 is smaller than the second threshold Vth2. In the pixels 810a, 810b, and 810d, a High-level signal is output from the comparator 120 when the output voltage of the LPF 119 is greater than or equal to the second threshold Vth2. Thus, the Q terminal of the SR latch circuit 123 provided in each of the pixels 810a, 810b, and 810d is switched to the High level. Thereafter, even if the amount of light received by the pixels 810a, 810b, and 810d decreases, the Q terminal of the SR latch circuit 123 provided in each of the pixels 810a, 810b, and 810d is kept at the High level.

The pixel 810c is provided with a color filter that transmits infrared light, i.e. is an IR pixel. The pixel 810a is an R pixel, and is provided with a color filter that transmits light in a predetermined wavelength range corresponding to R (red), and does not transmit infrared light. The pixel 810b is a G pixel, and is provided with a color filter that transmits light in a predetermined wavelength range corresponding to G (green), and does not transmit infrared light. The pixel 810d is a B pixel, and is provided with a color filter that transmits light in a predetermined wavelength range corresponding to B (blue), and does not transmit infrared light. That is to say, the unit pixel 840 according to this embodiment is a unit pixel that is based on a Bayer array, and in which one of two G pixels that constitute a unit pixel in a Bayer array is replaced with an IR pixel. In this embodiment, since the IR pixel 810c is provided, distance measurement can be performed using the IR pixel 810c while capturing an image using the R pixels 810a, the G pixels 810b, and the B pixels 810d. Also, by operating only the IR pixels 810c in main subject areas, in which a main subject is located, in the ranging mode, not only a visible-light image but also an infrared image can be acquired. Note that a known face detection technique or the like may be used to detect a main subject.

Figure 9:
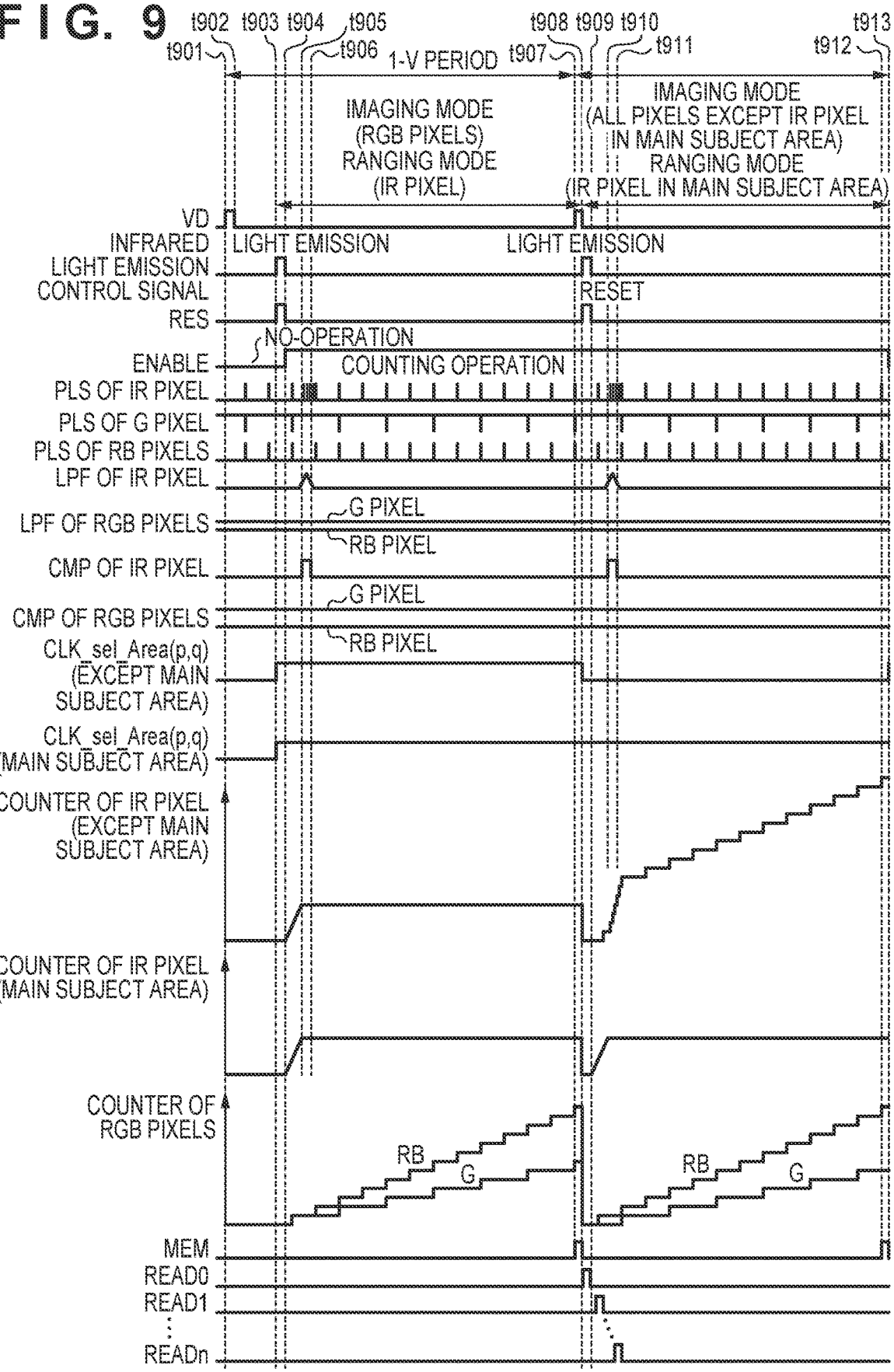
FIG. 9 is a timing chart illustrating an operation of the solid-state image sensor according to the third embodiment.

FIG. 9 is a timing chart illustrating an operation of the solid-state image sensor 800 according to this embodiment. The period from timing t901 to timing t907 is a 1-V period, which is a period that corresponds to a cycle of the synchronizing signal VD. The period from timing t907 to timing t913 is also a 1-V period, which is a period that corresponds to a cycle of the synchronizing signal VD. FIG. 9 shows a timing chart that corresponds to acquisition of the first frame and acquisition of the second frame. During acquisition of the first frame, for example, all R pixels 810a, G pixels 810b, and B pixels 810d are caused to operate in the imaging mode, whereas all IR pixels 810c are caused to operate in the ranging mode. During acquisition of the second frame, for example, the IR pixels 810c located in the main subject areas are caused to operate in the ranging mode, whereas all pixels 810 except these IR pixels 810c are caused to operate in the imaging mode.

At timing t901, the synchronizing signal VD is switched to the High level. At timing t902, the synchronizing signal VD is restored to the Low level.

At timing t903, the control unit 404 sets an infrared light emission control signal for causing the infrared light emitting unit 409IR to emit light to the High level. Thus, the infrared light emitting unit 409IR starts emitting light. Also, at timing t903, the timing generator 102 sets the reset signal RES to the High level. Thus, the counter 114 and the SR latch circuit 123 in each pixel 810 are reset. Also, at timing t903, the timing generator 102 changes the control signal CLK_sel_Area(p, q) provided to all areas Area(p, q) from the Low level to the High level. Thus, in all IR pixels 810c provided in the pixel array 830, the input selection switch 115 is set so that the clock signal CLK is input to the input terminal of the counter 114. As a result, all IR pixels 810c provided in the pixel array 830 can operate in the ranging mode.

At timing t904, the control unit 404 sets the infrared light emission control signal for causing the infrared light emitting unit 409IR to emit light to the Low level. Thus, the infrared light emitting unit 409IR stops emitting light. Also, at timing t904, the timing generator 102 sets the reset signal RES to the Low level, and sets the enable signal ENABLE to the High level. The reset of the counter 114 is released upon the reset signal RES being switched to the Low level, and the counter 114 starts the counting operation upon the enable signal ENABLE being switched to the High level. Infrared light emitted from the infrared light emitting unit 409IR is reflected off a subject, and the reflected light reaches the pixels 810 arranged on the imaging plane of the solid-state image sensor 800. Upon the light reflected off the subject reaching the pixels 810 arranged on the imaging plane of the solid-state image sensor 800, the time interval between pulses of the pulse signal PLS narrows in the IR pixels 810c. Upon the time interval between pulses of the pulse signal PLS narrowing in the IR pixels 810c, the voltage of the signal output from the LPF 119 provided in each IR pixel 810c increases. Then, the voltage of the signal output from the LPF 119 provided in an IR pixel 810c becomes greater than or equal to the first threshold Vth1 at timing t905. As a result, the signal output from the comparator 120 provided in each IR pixel 810c is switched to the High level. The time difference between timing t903 and timing 1905 is proportional to the distance to the subject. The control signal CLK_sel_Area(p, q) is at the High level. For this reason, upon the High-level signal being output from the comparator 120 provided in each IR pixel 810c, the signal output from the NAND element 117 provided in the IR pixel 810c is switched to the Low level Upon the signal output from the NAND element 117 provided in each IR pixel 810c being switched to the Low level, the signal output from the AND element 118 provided in the IR pixel 810c is switched to the Low level. Also, upon the signal output from the NAND element 117 provided in each IR pixel 810c being switched to the Low level, the enable terminal of the counter 114 provided in the IR pixel 8110c is switched to the Low level. Thus, the ranging count value that is based on the time difference between timing t903 and timing t905 is acquired by the counter 114 provided in each IR pixel 810c. Note that the signal output from the comparator 120 provided in each IR pixel 810c is switched to the Low level at timing t906.

On the other hand, in the R pixels 810a, the G pixels 810b, and the B pixels 810d, at timing t904, the counter 114 starts counting the pulse signal PLS output from the inverter 113. Upon a photon being incident on the SPAD 111 provided in each of the R pixels 810a, the G pixels 810b, and the B pixels 810d, a signal is generated by this SPAD 111, and a pulse signal PLS whose waveform has been shaped is output from the inverter 113. The counter 114 provided in each of the R pixels 810a, the G pixels 810b, and the B pixels 810d counts the number of pulses of the pulse signal PLS output from the inverter 113 provided therein.

At timing t907, the synchronizing signal VD is switched to the High level, and the control pulse MEM is switched to the High level. Upon the control pulse MEM being switched to the High level, the transfer switch 121 enters the ON state, and the count value of the counter 114 is stored in the pixel memory 116. Accordingly, the count values obtained by the counters 114 provided in the R pixels 810a, the G pixels 810b, and the B pixels 810d serve as the imaging count value of the R pixels 810a, the G pixels 810b, and the B pixels 810d, respectively. Also, the count value obtained by the counters 114 provided in the IR pixels 810c serve as the ranging count value of the IR pixels 810c.

At timing t908, the control unit 404 sets the infrared light emission control signal for causing the infrared light emitting unit 409IR to emit light to the High level. Thus, the infrared light emitting unit 409IR starts emitting light. Also, at timing t908, the timing generator 102 sets the reset signal RES to the High level. Thus, the counter 114 and the SR latch circuit 123 in each pixel 810 are reset. Also, at timing t908, the timing generator 102 changes the control signal CLK_sel_Area(p, q) provided to the IR pixels 810c located in the areas other than the main subject areas from the High level to the Low level. Thus, in the IR pixels 810c located in the areas other than the main subject areas, the input selection switch 115 is set so that the pulse signal PLS output from the inverter 113 is input to the input terminal of the counter 114. Thus, the IR pixels 810c located in the areas other than the main subject areas operates in the imaging mode. On the other hand, the control signal CLK_sel_Area (p, q) provided to the IR pixels 810c located in the main subject areas is kept at the High level. Accordingly, the IR pixels 810c located in the main subject areas continue to operate in the ranging mode. The R pixels 810a, the G pixels 810b, and the B pixels 810d continue to operate in the imaging mode.

Note that a description has been given here while taking, as an example, a case of supplying a High-level control signal CLK_sel_Area(p, q) to all IR pixels 810c located in the main subject areas, the present invention is not limited thereto. For example, a High-level control signal CLK_sel_Area(p, q) may only be provided to some of the IR pixels 810c out of a plurality of IR pixels 810c located in the main subject areas. This makes it possible to further reduce the number of IR pixels 810c to be used in distance measurement, and to obtain a more favorable infrared image. From timing t908 onward, pixel signal values are sequentially read out from respective rows. The imaging count values are read out from the R pixels 810a, the G pixels 810b, and the B pixels 810d, and the ranging count values are read out from the IR pixels 810c. Thus, these count values are read out from all rows.

At timing t909, the control unit 404 sets the infrared light emission control signal for causing the infrared light emitting unit 409IR to emit light to the Low level. Thus, the infrared light emitting unit 409IR stops emitting light. Also, at timing t909, the timing generator 102 sets the reset signal RES to the Low level. Upon the reset signal RES being switched to the Low level, the reset of the counter 114 is released, and the counter 114 starts the counting operation. The light emitted from the infrared light emitting unit 409IR is reflected off the subject, and the reflected light reaches the pixels 810 arranged on the imaging plane of the solid-state image sensor 800. Upon the light reflected off the subject reaching the pixels 810 arranged on the imaging plane of the solid-state image sensor 800, the time interval between pulses of the pulse signal PLS narrows in the IR pixels 810c. Upon the time interval between pulses of the pulse signal PLS narrowing in the IR pixels 810c, the voltage of the signal output from the LPF 119 provided in each IR pixel 810c increases. Then, the voltage of the signal output from the LPF 119 provided in an IR pixel 810c becomes greater than or equal to the first threshold Vth1 at timing t910. As a result, the signal output from the comparator 120 provided in each IR pixel 810c is switched to the High level. The control signal CLK_sel_Area(p, q) provided to the IR pixels 810c located in the main subject areas is at the High level. For this reason, upon the High-level signal being output from the comparator 120 provided in each IR pixel 810c in the main subject areas, the signal output from the NAND element 117 provided in the IR pixel 810c is switched to the Low level. Upon the signal output from the NAND element 117 provided in each IR pixel 810c located in the main subject areas being switched to the Low level, the signal output from the AND element 118 provided in each IR pixel 810c located in the main subject areas is switched to the Low level. Also, upon the signal output from the NAND element 117 provided in each IR pixel 810c located in the main subject areas being switched to the Low level, the enable terminal of the counter 114 provided in the IR pixel 810c located in the main subject areas is switched to the Low level. The time difference between timing t908 and timing t910 is proportional to the distance to the subject. The ranging count value that is based on the time difference between timing t908 and timing t910 is acquired by the counter 114 provided in each IR pixel 810c located in the main subject areas. Note that the signal output from the comparator 120 provided in each IR pixel 810c is switched to the Low level at timing t911. On the other hand, in the R pixels 810a, the G pixels 810b, and the B pixels 810d, at timing t909, the counter 114 starts counting the pulse signal PLS output from the inverter 113. Upon a photon being incident on the SPAD 111 provided in each of the R pixels 810a, the G pixels 810b, and the B pixels 810d, a signal is generated by this SPAD 111, and a pulse signal PLS whose waveform has been shaped is output from the inverter 113. The counter 114 provided in each of the R pixels 810a, the G pixels 810b, and the B pixels 810d counts the number of pulses of the pulse signal PLS output from the inverter 113 provided therein.

At timing t912, which is a timing immediately before timing t913, the control pulse MEM is switched to the High level. Upon the control pulse MEM being switched to the High level, the transfer switch 121 enters the ON state, and the count value of the counter 114 is stored in the pixel memory 116. The count values obtained by the counters 114 provided in the R pixels 810a, the G pixels 810b, and the B pixels 810d serve as the imaging count values of the R pixels 810a, the G pixels 810b, and the B pixels 810d, respectively. The count values obtained by the counters 114 provided in the IR pixels 810c located in the areas other than the main subject areas serve as the imaging count values of these IR pixels 810c. The count values obtained by the counters 114 provided in the IR pixels 810c located in the main subject areas serve as the ranging count values of these IR pixels 810c.

From timing t913 onward, pixel signal values are sequentially read out from respective rows. The imaging count values are read out from the R pixels 810a, the G pixels 810b, and the B pixels 810d, as well as the IR pixels 810c located in the areas other than the main subject areas. However, not only the imaging count values but also the output of the SR latch circuits 123 are read out from the R pixels 810a, the G pixels 810b, and the B pixels 810d. The ranging count values are read out from the IR pixels 810c located in the main subject areas. Thus, these count values are read out from all rows.

As described above, according to this embodiment, distance measurement can be performed using the IR pixels 810c while acquiring a visible-light image using the R pixels 810a, the G pixels 810b, and the B pixels 810d. In addition, by operating only some of the IR pixels 810c in the ranging mode, not only a visible-light image but also an infrared image can be acquired. That is to say, an infrared image can be obtained by using infrared light emitted from the infrared light emitting unit 409IR as illumination. Since a human cannot recognize infrared light with the naked eye, the image capture apparatus 400 according to this embodiment is favorable for monitoring, for example.

A pulse signal PLS with a frequency that is based on the amount of received light is output from the sensor unit 303. However, if the amount of light received by the sensor unit 303 increases and the next photon is received before a quenching operation is completed, the following phenomenon may occur. That is to say, the output of this sensor unit 303 then tends to be kept at the High level, and the output of the sensor unit 303 is switched to the Low level only when the quenching operation is completed in time. FIG. 9 shows an example of a case where this phenomenon is occurring in a G pixels 810b. That is to say, since the amount of received light is relatively small in the R pixels 810a and the B pixels 810d, the phenomenon in which the next photon is received before the quenching operation is completed is not occurring. On the other hand, in the G pixels 810b, in which the amount of received light is relatively large, the phenomenon in which the next photon is received before the quenching operation is completed is occurring. Accordingly, in the example shown in FIG. 9, the count values of the counters 114 provided in the G pixels 810b are smaller than the count values of the counters 114 provided in the R pixels 810a and the B pixels 810d. In this embodiment, in the case where this phenomenon occurs, a signal that is based on the amount of light that is originally to be received is obtained by the signal processing unit 402 performing the following correction processing.

Next, correction processing performed in the image capture apparatus 400 according to this embodiment will be described with reference to FIGS. 10 and 11.

Figure 10:
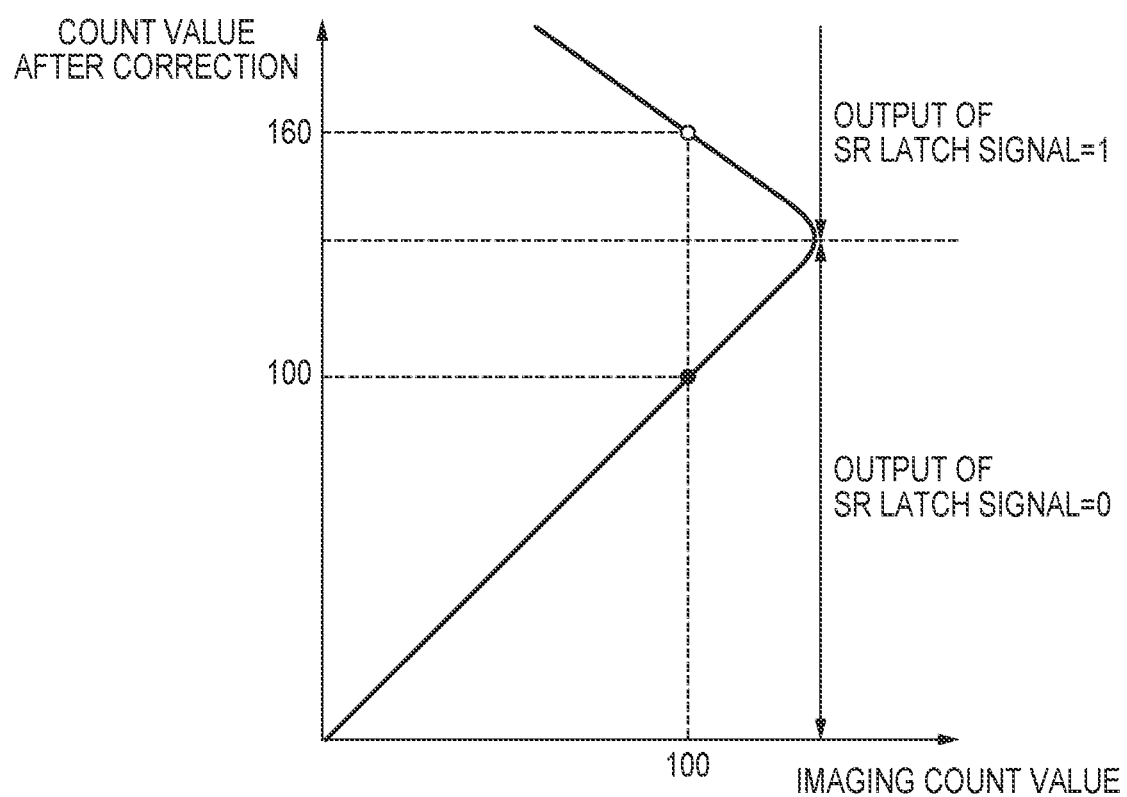
FIG. 10 illustrates an example of a lookup table used in correction processing.

FIG. 10 illustrates an example of a lookup table (LUT) used in the correction processing. The horizontal axis indicates the imaging count value. The vertical axis indicates the corrected imaging count value. As mentioned above, there may be cases where the imaging count value decreases if the amount of received light is too large. Whether or not the imaging count value has decreased due to the amount of received light being large can be determined based on the output of the SR latch circuit 123 provided in the pixel 810. That is to say, if the output of the SR latch circuit 123 is at the High level, i.e. is 1, it can be determined that the imaging count value has decreased due to the amount of received light being large. On the other hand, if the output of the SR latch circuit 123 is at the Low level, i.e. is 0, it can be determined that an imaging count value that is based on the amount of received light is obtained. For example, if the output of the SR latch circuit 123 is 0, the imaging count value is determined based on a lookup table for the case where the output of the SR latch circuit 123 is 0. As is understood from FIG. 10, if the imaging count value output from a pixel 810 is 100, and the output of the SR latch circuit 123 provided in this pixel 810 is 0, the corrected imaging count value that corresponds to this imaging count value is 100. Accordingly, in this case, an imaging count value of 100 is used as pixel data. If the output of the SR latch circuit 123 is 1, the imaging count value is determined based on a lookup table for the case where the output of the SR latch circuit 123 is 1. As is understood from FIG. 10, if the imaging count value output from a pixel 810 is 100, and the output of the SR latch circuit 123 provided in this pixel 810 is 1, the corrected imaging count value that corresponds to this imaging count value is 160. Accordingly, in this case, an imaging count value of 160 is used as pixel data. Note that these lookup tables are stored, in advance, in the memory 403 provided in the image capture apparatus 400.

Figure 11:
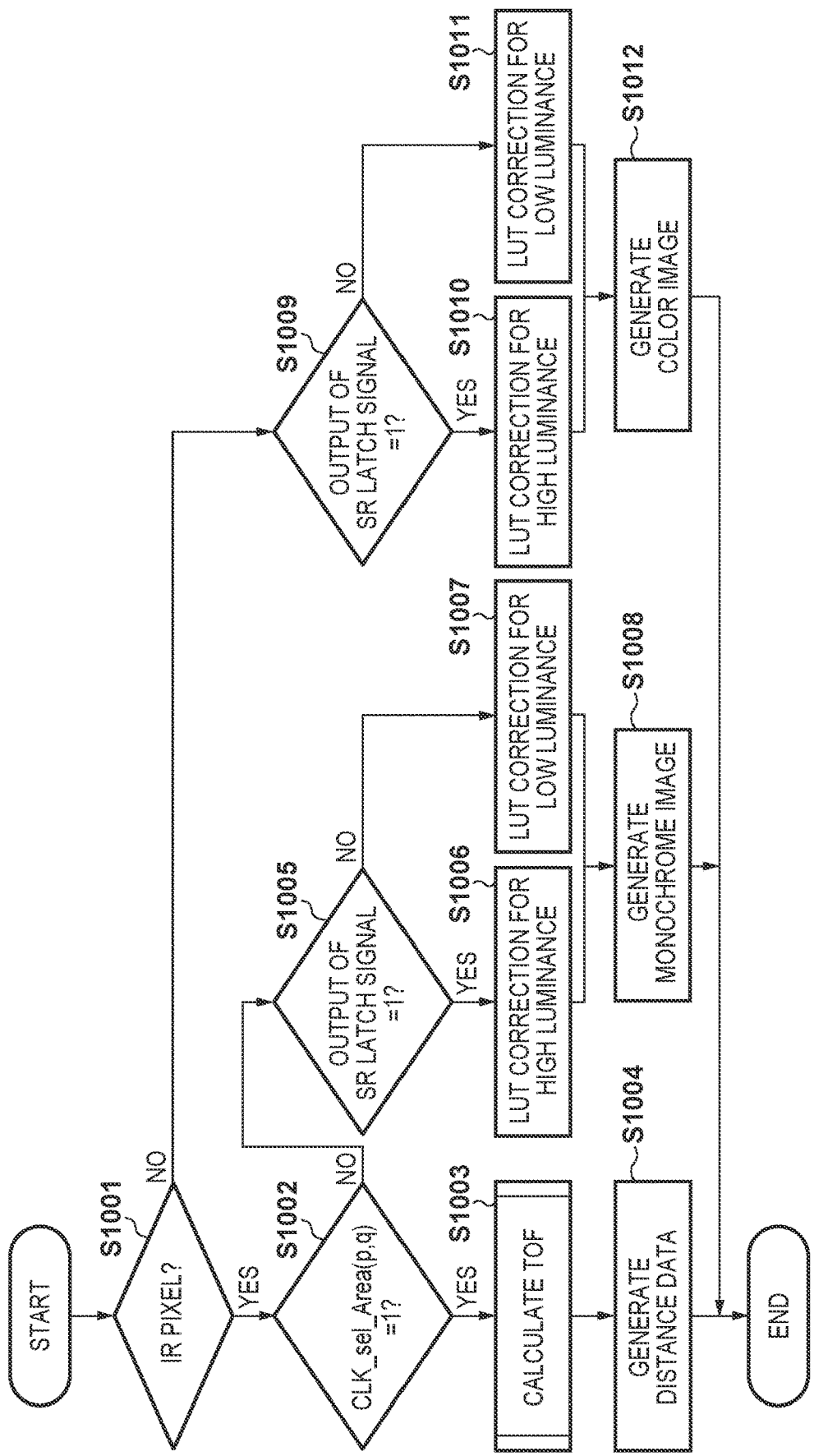
FIG. 11 is a flowchart illustrating an operation of an image capture apparatus according to the third embodiment.

FIG. 11 is a flowchart illustrating an operation of the image capture apparatus 400 according to this embodiment.

Initially, in step S1001, the signal processing unit 402 determines whether or not a signal that is to be subjected to processing has been acquired by an IR pixel 810c. If the signal that is subjected to processing has been acquired by an IR pixel 810c (YES in S1001), the processing proceeds to step S1002. If the signal that is subjected to processing has not been acquired by an IR pixel 810c (NO in S1001), the processing proceeds to step S1009.

In step S1002, the signal processing unit 402 determines whether or not the control signal CLK_sel_Area(p, q) provided to this IR pixel 810c is at the High level, i.e. is 1. If the control signal CLK_sel_Area(p, q) provided to this IR pixel 810c is 1 (YES in S1002), the processing proceeds to step S1003. On the other hand, if the control signal CLK_sel_Area(p, q) provided to this IR pixel 810c is 0 (NO in S1002), the processing proceeds to step S1005.

In step S1003, the signal processing unit 402 calculates the time of flight of light tTOF as an example of the information regarding distance, based on the ranging count value acquired by this IR pixel 810c.

In step S1004, the signal processing unit 402 generates range data based on the time of flight of light tTOF calculated in step S1003. The thus-generated range data can be used in autofocus processing. In autofocus processing, the control unit 404 provided in the image capture apparatus 400 drives the optical system 401 via the optical system driving unit 408 based on the range data calculated in step S1004.

In step S1005, the signal processing unit 402 determines whether or not the output of the SR latch circuit 123 included in this IR pixel 810c is at the High level, i.e. is 1. If the output of the SR latch circuit 123 included in the IR pixel 810c is 1 (YES in S1005), the processing proceeds to step S1006. On the other hand, if the output of the SR latch circuit 123 included in the IR pixel 810c is 0 (NO in S1005), the processing proceeds to step S1007.

In step S1006, the signal processing unit 402 performs correction processing based on a lookup table for the case where the output of the SR latch circuit 123 is 1, i.e. a lookup table for high luminance.

In step S1007, the signal processing unit 402 performs correction processing based on a lookup table for the case where the output of the SR latch circuit 123 is 0, i.e. a lookup table for low luminance.

In step S1008, a monochrome infrared image is generated based on the imaging count value that is thus obtained from the IR pixel 810c.

In step S1009, the signal processing unit 402 determines whether or not the output of the SR latch circuit 123 included in each of the pixels 810a, 810b, and 810d, is 1. If the output of the SR latch circuit 123 included in each of the pixels 810a, 810b, and 810d, is 1 (YES in S1009), the processing proceeds to step S1010. On the other hand, if the output of the SR latch circuit 123 included in each of the pixels 810a, 810b, and 810d, is 0 (NO in S1009), the processing proceeds to step S1011.

In step S1010, the signal processing unit 402 performs correction processing based on a lookup table for the case where the output of the SR latch circuit 123 is 1, i.e. a lookup table for high luminance.

In step S1011, the signal processing unit 402 performs correction processing based on a lookup table for the case where the output of the SR latch circuit 123 is 0, i.e. a lookup table for low luminance.

In step S1012, a color visible-light image is generated based on the imaging count value that is thus obtained from each of the pixels 810a, 810b, and 810d. Note that, when the visible-light image is generated, a G signal at the position of an IR pixel 810c may be generated by performing interpolation processing using the imaging count value of a G pixel 810b.

Thus, processing shown in FIG. 11 ends.

As described above, according to this embodiment, a visible-light image can be acquired using the imaging count values acquired by the R pixels 810a, the G pixels 810b, and the B pixels 810d, while performing distance measurement using the ranging count values acquired by the IR pixels 810c. Since the IR pixels 810c can also acquire the imaging count values, according to this embodiment, an infrared image can also be acquired using the imaging count values acquired by the IR pixels 810c. By using only some IR pixels 810c in distance measurement, a visible-light image and an infrared image can be acquired while performing distance measurement using these IR pixels 810c. An infrared image can also be obtained using infrared light emitted by the infrared light emitting unit 40918 as illumination. Since a human cannot recognize infrared light with the naked eye, the image capture apparatus 400 according to this embodiment is favorable for monitoring, for example.

Fourth Embodiment

Figure 12A:
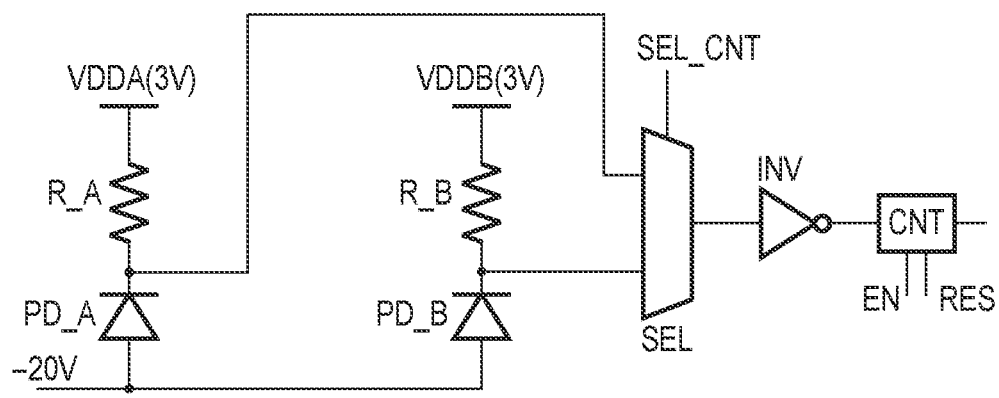
FIGS. 12A to 12C relate to a unit pixel according to a fourth embodiment.

Next, the fourth embodiment will be described with reference to FIGS. 12A to 12C. This embodiment employs a configuration in which an SPAD for distance measurement and an SPAD for image capture are separately provided in each unit pixel. The configuration of peripheral circuits other than unit pixels may be similar to those according to the first to third embodiments. FIG. 12A shows an example of an equivalent circuit of a unit pixel according to this embodiment. Each unit pixel includes SPADs PD_A and PD_B that serve as light-receiving regions. The SPADs PD_A and PD_B each include a depletion region that is formed by applying a reverse bias voltage to a PN junction. Positive voltages VDDA and VDDB (both 3 V, for example) are applied from a voltage supply unit (not shown) to cathode terminals of the SPADs PD_A and PD_B, via resistors R_A and R_B that serve as independent quenching circuits, respectively.

Meanwhile, a negative voltage (−20 V, for example) is applied, in common, to anode terminals of the SPADs PD_A and PD_B. By thus applying a large reverse bias voltage, one electron that is generated by photoelectrically converting a single photon received by a light-receiving region can be subjected to avalanche multiplication. The current flowing due to avalanche multiplication causes the potential at the cathode terminals of the SPADs PD_A and PD_B to drop to −20 V, but this current can be canceled with a certain time constant, as a result of the resistors R_A and R_B being provided as quenching circuits (so-called Geiger-mode operation). After the current no longer flows through the resistors R_A and R_B, the potential at the cathode terminals of the SPADs PD_A and PD_B is restored to 3 V. That is to say, one voltage pulse is generated by one electron generated by photoelectrically converting a single photon.

The cathode terminals of the SPADs PD_A and PD_B are also connected to input terminals of a selector SEL. The selector SEL selectively provides one of the signals input to the two input terminals to an inverter INV, based on a control signal SEL_CNT. The control signal SEL_CNT is output by the TG 102, which was described in the prior embodiments, for example. The inverter INV shapes the voltage pulse output by each SPAD to generate a pulse signal, similarly to the inverter 113 according to the prior embodiments.

The pulse signal generated by the inverter INV is input to a counter CNT. The counter CNT counts the pulse signal. The counter CNT includes an enable terminal EN and a reset terminal RES, and an enable signal PEN and a reset signal PRES output by the TG 102, which was described in the prior embodiments, are input to the enable terminal EN and the reset terminal RES, respectively. Since a count value of the counter CNT in a predetermined counting period is proportional to the number of voltage pulses generated based on the amount of received light, the count value is equivalent to the value obtained by AD-converting the amount of received light.

In the imaging mode, the TG 102 controls the selector SEL by means of SEL_CNT so that the cathode terminal of the SPAD PD_A is connected to the inverter INV. The TG 102 also causes the power supply VDDB of the SPAD PD_B to enter a floating state.

On the other hand, in the ranging mode, the TG 102 controls the selector SEL by means of SEL_CNT so that the selector SEL connects the cathode terminal of the SPAD PD_B to the inverter INV. The TG 102 also causes the power supply VDDA of the SPAD PD_A to enter a floating state.

Figure 12B:
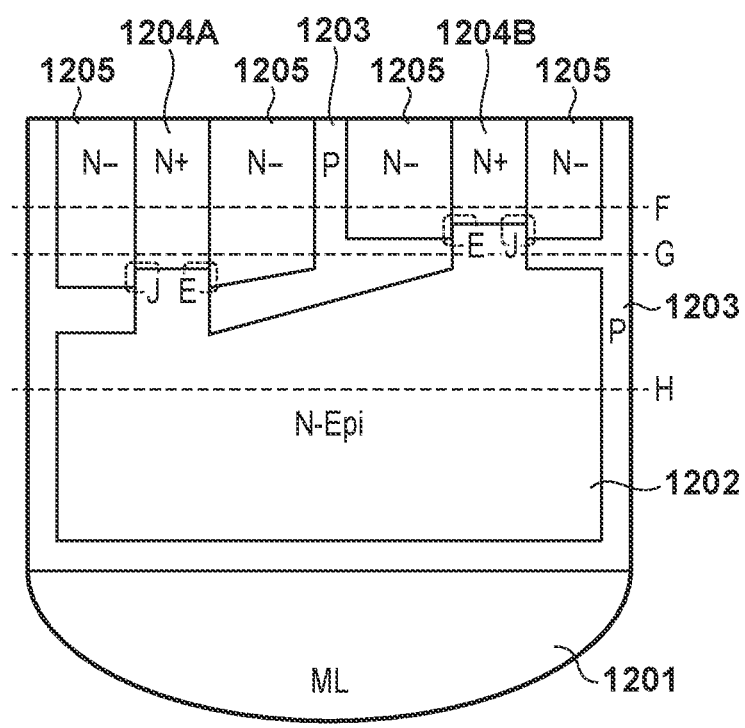
Figure 12C:
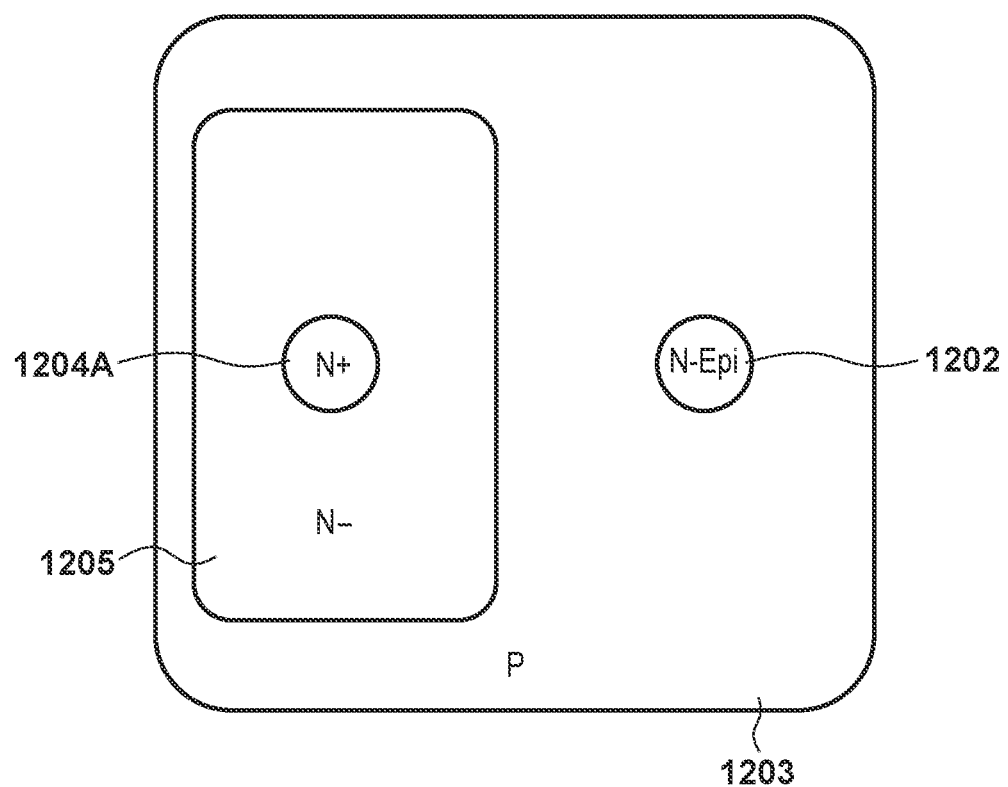

FIG. 12B is a vertical cross-sectional view showing a structural example of the unit pixel shown in FIG. 12A. It is assumed in FIG. 12B that light is incident on a microlens 1201 from the lower side of the diagram.

The microlens (ML) 1201 collects a light beam that is incident from the imaging optical system. An N-type epitaxial layer (N-Epi) 1202, which serves as a first conductivity-type region, functions as a portion of a light receiving region.

A large negative voltage (−20 V, for example) is applied to a P-type semiconductor region (P) 1203, which serves as a second conductivity-type region, via a predetermined contact electrode. In FIG. 12B, the P-type semiconductor region 1203 is shown at two positions that are a position between pixels each being defined by a microlens 1201, and a position between later-described first conductivity-type regions N+ 1204A and 1204B, but is formed integrally. The P-type semiconductor region 1203 has a function of absorbing positive holes using drift thereof, the positive holes being generated when photoelectrically converting a single photon incident on depletion regions formed between the P-type semiconductor region 1203 and later-described N-type regions of the first conductivity type to which a positive voltage is applied, and discharging the absorbed positive holes to the outside of the image sensor.

The first conductivity-type regions 1204A and 1204B are formed as electrically isolated regions within a unit pixel that is defined by the microlens 1201. The first conductivity-type regions 1204A and 1204B, to which a positive voltage (3 V, for example) is applied respectively via the resistors R_A and R_B serving as quenching circuits, function as cathode terminals of PN junction photodiodes that are formed between the first conductivity-type regions 1204A and 1204B and the P-type semiconductor region 1203. The first conductivity-type regions 1204A and 1204B are connected to inverters INV_A and INV_B, respectively.

Also, the first conductivity-type regions 1204A and 1204B absorb electrons using drift thereof, the electrons being generated when photoelectrically converting a single photon incident on the depletion regions formed between the first conductivity-type regions 1204A and 1204B and the P-type semiconductor region 1203, and causes avalanche multiplication in a high electric field region E in which the distance to the P-type semiconductor region 1203 is shortest in the diagram. The P-type semiconductor region 1203 continuously extends between the first conductivity-type regions 1204A and 1204B, and has a joint face in which the P-type semiconductor region 1203 is joined to the N-type epitaxial layer 1202. This configuration can promote drifting of electrons generated in the depletion regions toward the first conductivity-type regions 1204A and 1204B, cause all of these electrons to move into the high electric field region E before the electrons are recombined, and cause avalanche multiplication. That is to say, a single photon that is vertically incident on a midpoint between the first conductivity-type regions 1204A and 1204B through the microlens 1201 is subjected to avalanche multiplication in the high electric field region E between the first conductivity-type region 1204A and the P-type semiconductor region 1203 at a probability of 50%, and is subjected to avalanche multiplication in the high electric field region E between the first conductivity-type region 1204B and the P-type semiconductor region 1203 at a probability of 50%. As a result, a photon can be detected reliably.

Furthermore, the P-type semiconductor region 1203 between pixels is extended, and thus, new high electric fields J are provided between the P-type semiconductor region 1203 and the first conductivity-type regions 1204A and 1204B. This configuration can also reliably subject, to avalanche multiplication, an electron that has been generated by photoelectric conversion in a light-receiving region that is near the microlens 101 and is far from a cathode terminal N+ 1204A or N+ 1204B, and accordingly, a blur effect can be obtained when an image in a short wavelength region is captured with a back-side illumination structure, similarly to the case of not dividing a photoelectric converter portion.

In this embodiment, the first conductivity-type region 1204A, which functions as a cathode terminal of the SPAD PD_A, is arranged at a position closer to the microlens in a semiconductor device than the first conductivity-type region 1204B, which functions as a cathode terminal of the SPAD PD_B. A silicon (Si) semiconductor has light absorption properties that the shorter the wavelength, the shorter the penetration length, and the longer the wavelength, the longer the penetration length.

In the case of using infrared light in distance measurement using a TOF method, reflected light from a subject has a long wavelength, and accordingly reaches a deep portion distant from the microlens 1201 and is then photoelectrically converted. Accordingly, by forming the first conductivity-type region 1204B that forms the SPAD PD_B for distance measurement at a position distant from the microlens 1201, if avalanche multiplication is caused at a position at which infrared light is photoelectrically converted sufficiently, signals associated with distance measurement can be fully detected.

On the other hand, a visible light beam contains a short wavelength light, whereas a long wavelength, such as that of infrared light, does not need to be detected. For this reason, by forming the first conductivity-type region 1204A, which forms the SPAD PD_A for image capture, at a position near the microlens 1201, the wavelength range of a visible light beam is sufficiently subjected to photoelectric conversion, and can be detected while suppressing detection of infrared light. Note that, when the positive voltage VDDB node is set in a floating state when in the imaging mode, the first conductivity-type region 1204B is in a non-reset state in the SPAD PD_B, and accordingly the SPAD PD_B is in an equilibrium state of being filled with electrons generated during the previous frame and those generated due to a dark current, and cannot newly move, by drift, electrons generated in the light-receiving region. For this reason, all new electrons generated in the light-receiving region move by drift into the first conductivity-type region 1204A in the SPAD PD_A, and contribute to avalanche multiplication, and thus, the imaging signal can be collectively detected by the SPAD PD_A. When in the ranging mode, conversely, all new electrons generated in the light-receiving region move by drift into the first conductivity-type region 1204B in the SPAD PD_B, and contribute to avalanche multiplication. FIG. 12C is a schematic diagram of a horizontal cross-section taken at the position G in FIG. 12B and viewed from the microlens 1201 side.

Fifth Embodiment

Next, the fifth embodiment will be described with reference to FIGS. 13A to 14B. This embodiment employs a configuration in which the first conductivity-type regions 1204A and 1204B in the fourth embodiment are provided at the same distance from the microlens 1201. By separately dealing with the output of the first conductivity-type regions 1204A and 1204B that share one microlens 1201, distance measurement that is based on the principle of autofocus using the phase-difference detection method is realized. Since the technique is known with which a plurality of photoelectric converter portions that share one microlens are provided, and a phase difference between signals obtained from the respective photoelectric converter portions is detected to obtain the defocus amount in the imaging optical system, descriptions of the details thereof is omitted. Furthermore, if the defocus amount is obtained, the focusing lens position that corresponds to the in-focus distance can be specified, and thus, the distance can be specified. The distance can also be obtained for each pixel. On the other hand, image capture is realized by collectively dealing with the output of the first conductivity-type regions 1204A and 1204B that share one microlens 1201.

Figure 13A:
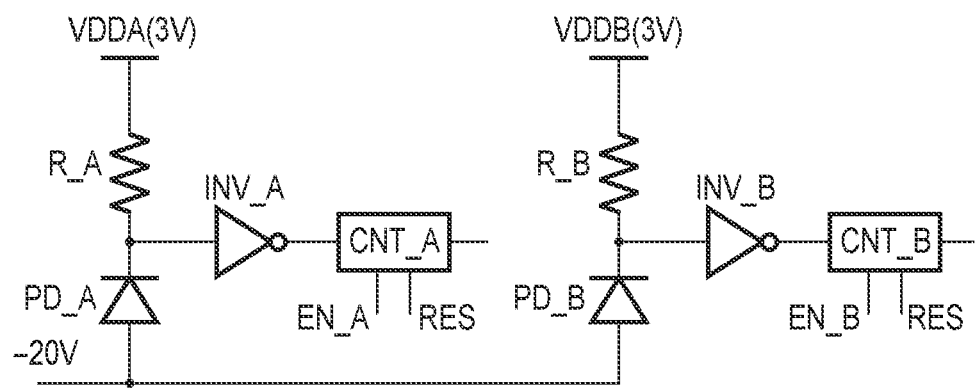
FIGS. 13A and 13B relate to a unit pixel according to a fifth embodiment.

FIG. 13A shows an example of an equivalent circuit of a unit pixel according to this embodiment. This embodiment differs from the fourth embodiment in that an inverter and a counter are provided for each SPAD. That is to say, an inverter INV_A and a counter CNT_A are connected to a cathode electrode of the SPAD PD_A, and an inverter INV_B and a counter CNT_B are connected to a cathode electrode of the SPAD PD_B. The function of the inverters INV_A and INV_B is the same as that of the inverter INV in the fourth embodiment, and the function of the counters CNT_A and CNT_B is the same as that of the counter CNT in the fourth embodiment. Control signals EN_A and EN_B for the counters CNT_A and CNT_B, and RES are provided from the TG 102.

A back-side illumination structure is favorably used in an image capture apparatus that has the unit pixels according to this embodiment in the pixel array. In this case, the counters CNT_A and CNT_B are provided on a different substrate that is stacked on the side opposite to the light incident direction, and the control signals EN_A and EN_B, and so on, can be provided to the counters CNT_A and CNT_B using through silicon vias (TSVs).

Figure 13B:
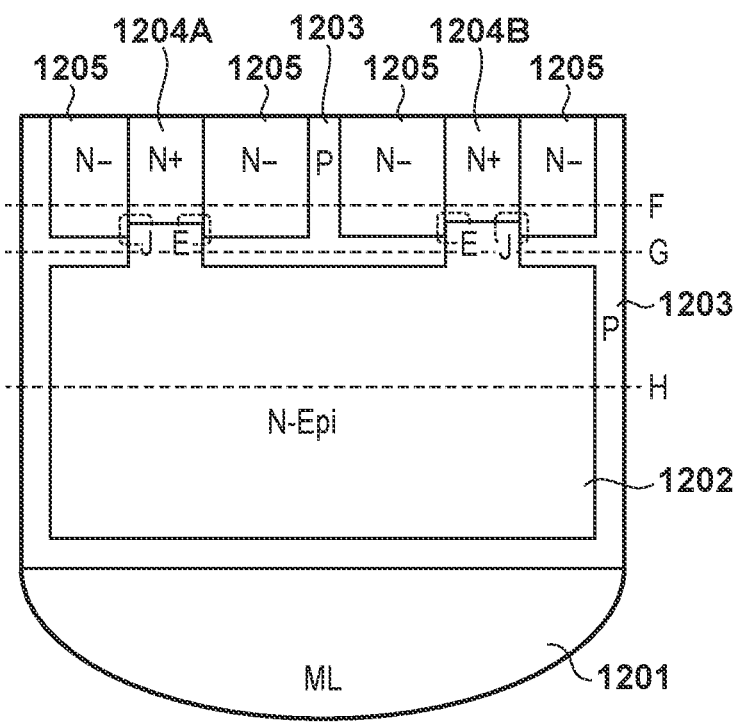

FIG. 13B is a vertical cross-sectional view showing a structural example of the unit pixel shown in FIG. 13A, and the same constituent elements as those in the fourth embodiment are assigned the same signs as those in FIG. 12B. As is understood from comparison with FIG. 12B, a structural difference from the fourth embodiment lies in that the configuration associated with the SPAD PD_A is equal to the configuration associated with the SPAD PD_B. In particular, a difference lies in that the distance from the microlens 1201 to the first conductivity-type region 1204A is equal to the distance from the microlens 1201 to the first conductivity-type region 1204B. In other words, a difference lies in that the first conductivity-type regions 1204A and 1204B are provided at equal positions in the depth direction. Furthermore, as a result of the position of the first conductivity-type region 1204A being different, the configurations of first conductivity-type regions 1202 and 1205, as well as the second conductivity-type region 1203 that are in contact with the first conductivity-type region 1204A also differ.

In this embodiment, the first conductivity-type regions 1204A and 1204B cause avalanche multiplication at the same depth. Note that FIG. 13B shows, as an example, a configuration in which the position of the first conductivity-type region 1204A is aligned with the position of the first conductivity-type region 1204B. However, to suppress the influence of infrared light and increase the detection efficiency for the wavelength range of a visible light beam, a configuration may be employed in which the position of the first conductivity-type region 1204B is aligned with the position of the first conductivity-type region 1204A in the fourth embodiment.

Next, a method for driving the image sensor according to this embodiment will be described with reference to FIGS. 14A and 14B.

Figure 14A:
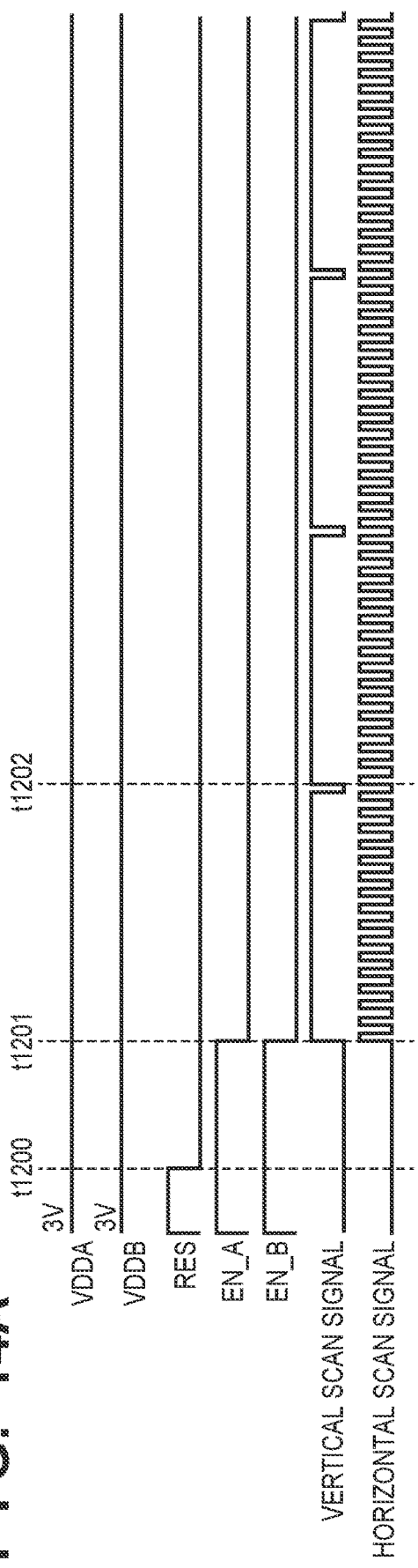
FIGS. 14A and 14B illustrate examples of timing charts of control signals according to the fifth embodiment.

FIG. 14A shows an example of a timing chart of control signals in a first driving mode. Note that the positive voltages VDDA and VDDB (3 V, for example) and a reverse bias of −20 V are applied to operate the SPAD PD_A and PD_B in the Geiger mode.

At time t1200, the TG 102 switches a reset control signal RES to the Low level to cancel the reset of the counters CNT_A and CNT_B. At this time, if the enable control signals EN_A and EN_B are at the High level, the counters CNT_A and CNT_B start counting the number of voltage pulses that are generated with a Geiger mode operation occurring at the SPADs PD_A and PD_B and the resistors R_A and R_B.

The counters CNT_A and CNT_B count the number of voltage pulses input from the inverters INV_A and INV_B until time T1201 at which the TG 102 switches the control signals EN_A and EN_B to the Low level. Accordingly, the voltage pulse counting period is from time t1200 to t1201. The count values of the counters CNT_A and CNT_B are read out from time t1201 onward. At time t1201, the vertical scan unit 101 sets a vertical scan signal (readout signal READ0) for a zeroth row to the High level to select p=0$^{th}$ row.

Until time t1202 at which the vertical scan signal (READ1) for a first row is switched to the High level and p=1' row is selected, a horizontal scan signal (selection signal of column memory 103) is sequentially output from the horizontal scan unit 104, and the count values for eight pixels in p=0$^{th}$ row are read out. In FIG. 14A, to read out the count values from the counters CNT_A and CNT_B, the polarity of the horizontal scan signals is repeatedly switched 16 times, which is twice the number of pixels.

Similar scan is performed on p=1$^{st}$ row to p=3$^{rd}$ row from time t1202 onward. An image signal (hereinafter called image A signal) generated using a count value group read out from the counters CNT_A in the pixels, and an image signal (hereinafter called image B signal) generated using a count value group read out from the counters CNT_B in the pixels, are signals for distance measurement. Meanwhile, a pixel signal for generating a captured image can be obtained by adding the count values of the counters CNT_A and CNT_B in each pixel. Thus, both a signal for distance measurement and a signal for generating an image can be obtained by means of the first driving mode of independently reading out the count values of the counters CNT_A and CNT_B included in the respective pixels. However, in the case where the signal for distance measurement does not need to be read out from the image sensor, e.g. in the case of acquiring the signal for distance measurement using a sensor separate from the image sensor, an image signal can be read out from the image sensor by means of a second driving mode, which is described below.

Figure 14B:
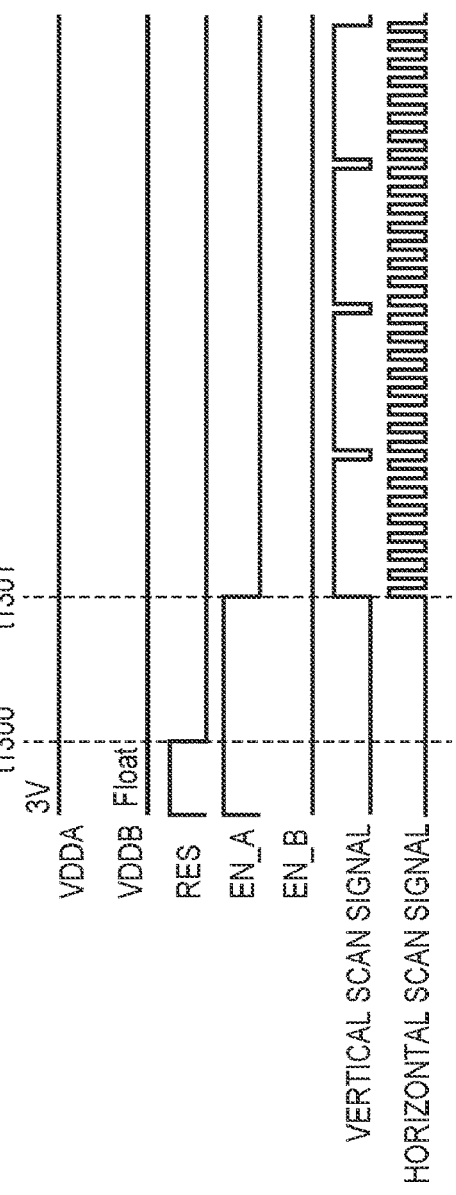

FIG. 14B shows an example of a timing chart of control signals in the second driving mode. A difference from FIG. 14A lies in that the positive voltage VDDB node is set in a floating state to cause the SPAD PD_B to perform a non-Geiger-mode operation, and an enable control signal EN_B for the corresponding counter CNT_B is set to the Low level.

Thus, only the SPAD PD_A is caused to perform the Geiger mode, the imaging signals are collectively detected by one of the SPADs (here, PD_A) at the stage of avalanche multiplication, and the voltage pulse is counted with one counter CNT_A. As mentioned above, in the case of setting VDDB in a floating state, all new electrons generated in the light-receiving region move by drift to the first conductivity-type region 1204A of the SPAD PD_A, and accordingly can be collectively detected by the counter CNT_A.

The length of the counting period from time t1300 to time t1301 is the same as that of the period from time t1200 to time t1201, but the number of times that the count value is read out is half the number of times in the first driving mode. Accordingly, the length of the readout period from time t1301 onward is half the length of the readout period in the first driving mode.

Note that, if the state of VDDB can be switched between a floating state and 3 V row by row, distance measurement can be performed for a specific row by setting VDDB for the specific row to 3 V and setting VDDB for the other rows in a floating state. For example, it is possible to both shorten the readout period and acquire a phase difference detection signal by performing distance measurement in an image center portion, such as in p=1$^{st}$ row or p=2$^{nd}$ row, where a main subject is often present, and obtaining only the imaging signal in the other areas. Furthermore, if the state of VDDB can be switched column by column, distance measurement can be performed for a specific column.

In addition, in the second driving mode, the positive voltage VDDA can be made higher than that in the first driving mode. Thus, when electrons generated in the light-receiving region are moved by drift to the first conductivity-type region 1204A, electrons are drifted first in a wider region to increase the efficiency of detection of a vertically incident photon, and a blur effect can be obtained that is similar to that obtained in the case of not dividing the photoelectric converter unit.

Sixth Embodiment

Next, the sixth embodiment will be described with reference to FIGS. 15A and 15B. This embodiment employs a configuration in which the first conductivity-type region 1202 in the fifth embodiment is divided into a region corresponding to the first conductivity-type region 1204A and a region corresponding to the first conductivity-type region 1204B. With this configuration as well, the count values of the counters CNT_A and CNT_B are separately read out using the first driving mode described in the fifth embodiment, and thus, distance measurement can be realized.

Figure 15A:
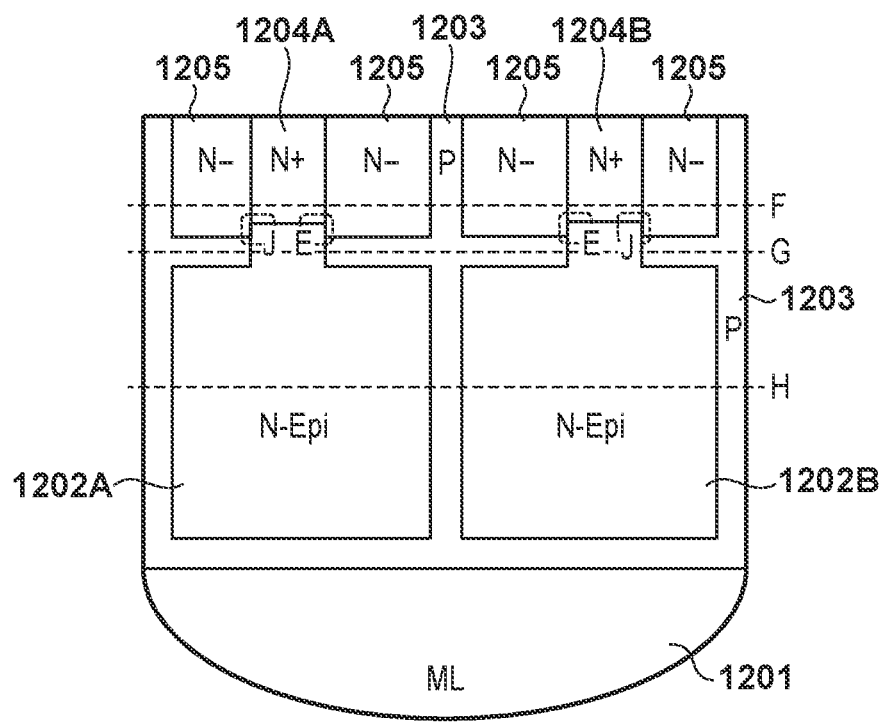
FIGS. 15A and 15B relate to a unit pixel according to a sixth embodiment.

FIG. 15A is a vertical cross-sectional view showing a configuration example of a unit pixel according to this embodiment, and the same constituent elements as those in the fourth or fifth embodiment are assigned the same reference numerals as those in FIG. 12B or 13B. Note that the equivalent circuit of the unit pixel is the same as that in FIG. 13A described in the fifth embodiment. Also, FIG. 15B shows a horizontal cross section taken at the position H in FIG. 15A and viewed from the microlens 1201 side. Note that FIG. 15A shows a vertical cross section taken at the position I in FIG. 15B.

Figure 15B:
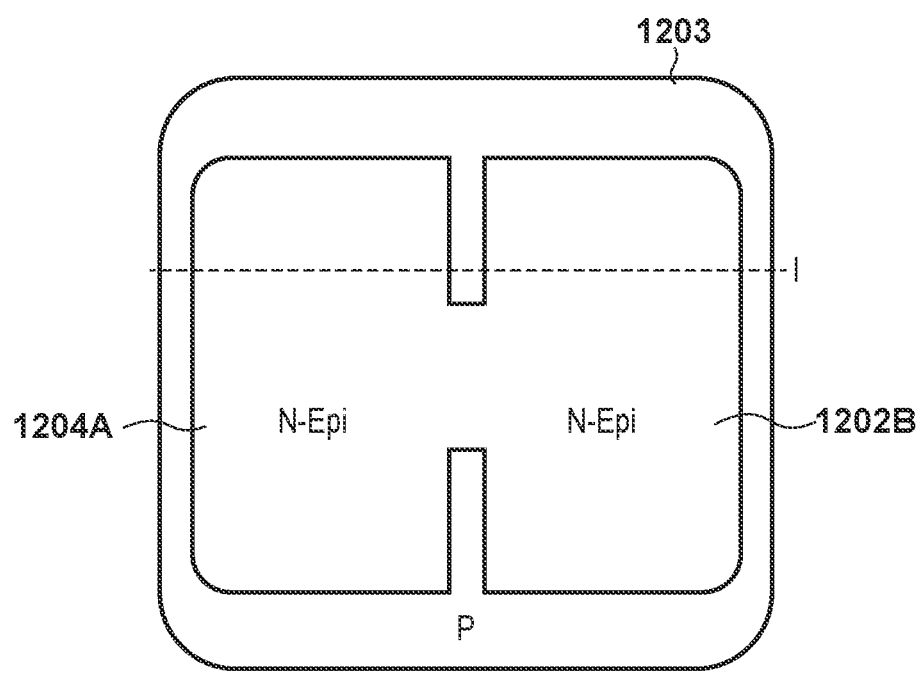

In this embodiment as well, the second conductivity-type region 1203 shown in FIGS. 15A and 15B is formed integrally. The second conductivity-type region 1203 has a function of absorbing positive holes using drift thereof, the positive holes being generated when photoelectrically converting a single photon incident on the depletion region formed between the second conductivity-type region 1203 and the N-type region of the first conductivity type to which the positive voltage VDD is applied, and discharging the absorbed positive holes to the outside of the image capture apparatus.

As shown in FIG. 15B, in this embodiment, the second conductivity-type region 1203 is discontinuous at an arbitrary area in a pixel, that is, between the SPADs PD_A and PD_B. As shown in FIG. 15B, an area in which the first conductivity-type regions 1202A and 1202B are connected is provided so that a charge obtained by photoelectrically converting one photon can move between the first conductivity-type regions 1204A and 1204B. Thus, the second driving mode can be realized if the positive voltage VDDA or VDDB node of the first conductivity-type region 1204A or 1204B is set in a floating state. That is to say, only the SPAD PD_A or PD_B is caused to perform the Geiger mode operation, and the imaging signal can be collectively detected by one of these SPADs at the stage of avalanche multiplication and counted by the counter CNT_A or CNT_B.

For example, when VDDB is set in a floating state, the first conductivity-type region in the SPAD PD_B is in a non-reset state. For this reason, the first conductivity-type region is in an equilibrium state of being filled with electrons generated during the previous frame and electrons generated due to a dark current. Accordingly, electrons generated in the light-receiving region cannot be moved by drift to the first conductivity-type region 1204B. For this reason, all new electrons generated in the light receiving region are moved by drift to the first conductivity-type region 1204A, and contribute to avalanche multiplication. Accordingly, it is possible to detect photons received by an entire pixel with one SPAD PD_A, and count the voltage pulses with one counter CNT_A. Since the timing chart of the control signals at the time of driving is the same as that in the fifth embodiment, descriptions thereof are omitted.

Modifications

Although preferable embodiments of the present invention have been described above, the present invention is not limited to these embodiments, and various modifications and variations may be made within the scope of the gist of the present invention.

For example, the above embodiments have described, as an example, a case where the solid-state image sensors 100, 500, and 800 are provided separate from the signal processing unit 402, but the present invention is not limited thereto. The signal processing unit 402 may be provided in the solid-state image sensors 100, 500, and 800. In this case, for example, the signal processing unit 402 can be provided on the substrate 302 (see FIG. 3A). Also, a substrate (not shown) on which the signal processing unit 402 is provided may be stacked on the substrate 302.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Applications No. 2017-167639, filed on Aug. 31, 2017, and No. 2018-134479, filed on Jul. 17, 2018, which are hereby incorporated by reference herein in their entirety.

What is claimed is:

1. A solid-state image sensor comprising a plurality of pixels, wherein each of the plurality of pixels includes:
   a sensor unit that generates a pulse signal upon reception of a photon;
   a low pass filter to which the pulse signal generated by the sensor unit is input;
   a comparator that compares output of the low pass filter with a threshold; and
   a counter configured to selectively switch between operating in a first mode of counting the number of pulses of the pulse signal generated by the sensor unit when a light emitting unit does not emit light, and operating in a second mode of counting the number of pulses of a predetermined signal, the number depending on an elapsed time from a timing at which light is emitted from the light emitting unit,
   wherein when operating in the second mode, the counter counts the number of pulses of the predetermined signal from a timing at which light is emitted from the light emitting unit until a timing at which output of the comparator is inverted.

2. The solid-state image sensor according to claim 1, further comprising:
   a switch that is set so that, when the counter operates in the first mode, the pulse signal generated by the sensor unit is provided to the counter, and is set so that, when the counter operates in the second mode, the predetermined signal is provided to the counter.

3. The solid-state image sensor according to claim 1,
wherein a first pixel, out of the plurality of pixels, is provided with a first color filter having a first transmitted wavelength range,
a second pixel, out of the plurality of pixels, is provided with a second color filter having a second transmitted wavelength range that differs from the first transmitted wavelength range,
when light with a wavelength within the first transmitted wavelength range is emitted from the light emitting unit, the counter provided in the first pixel is caused to operate in the second mode, and the counter provided in the second pixel is caused to operate in the first mode, and
when light with a wavelength within the second transmitted wavelength range is emitted from the light emitting unit, the counter provided in the second pixel is caused to operate in the second mode, and the counter provided in the first pixel is caused to operate in the first mode.

4. The solid-state image sensor according to claim 1,
wherein a first pixel, out of the plurality of pixels, is provided with a first color filter that transmits visible light within a predetermined wavelength range and does not transmit infrared light,
a second pixel, out of the plurality of pixels, is provided with a second color filter that transmits infrared light, and
infrared light is emitted from the light emitting unit.

5. The solid-state image sensor according to claim 1,
wherein the counter provided in a pixel located in a predetermined area, out of the plurality of pixels, is caused to operate in the second mode, and the counter provided in a pixel located in an area other than the predetermined area, out of the plurality of pixels, is caused to operate in the first mode.

6. The solid-state image sensor according to claim 1,
wherein electrical power provided to the low pass filter and the comparator is restricted when the counter operates in the first mode.

7. The solid-state image sensor according to claim 1, further comprising:
a correction unit that corrects a count value obtained by the counter when the counter operated in the first mode, based on the output of the comparator.

8. An image capture apparatus comprising:
a solid-state image sensor comprising a plurality of pixels; and
one or more processors that, when executing a program stored in a memory, function as a signal processing unit that processes a signal output from the solid-state image sensor,
wherein each of the plurality of pixels includes:
a sensor unit that generates a pulse signal upon reception of a photon;
a low pass filter to which the pulse signal generated by the sensor unit is input;
a comparator that compares output of the low pass filter with a threshold; and
a counter configured to selectively switch between operating in a first mode of counting the number of pulses of the pulse signal generated by the sensor unit when a light emitting unit does not emit light, and operating in a second mode of counting the number of pulses of a predetermined signal, the number depending on an elapsed time from a timing at which light is emitted from the light emitting unit,
wherein when operating in the second mode, the counter counts the number of pulses of the predetermined signal from a timing at which light is emitted from the light emitting unit until a timing at which output of the comparator is inverted.

9. The image capture apparatus according to claim 8,
wherein
the signal processing unit corrects a count value obtained by the counter when the counter that operated in the first mode, based on the output of the comparator.

10. The image capture apparatus according to claim 8,
wherein the signal processing unit generates an image based on a count value obtained by the counter that operated in the first mode, and calculates the distance to a subject based on a count value obtained by the counter that operated in the second mode.

11. An image capture apparatus comprising:
a solid-state image sensor comprising a plurality of pixels,
wherein each of the plurality of pixels includes a sensor unit that generates a pulse signal upon a reception of a photon, a low pass filter to which the pulse signal generated by the sensor unit is input, a comparator that compares output of the low pass filter with a threshold, and a counter; and
one or more processors that, when executing a program stored in a memory, function as a control unit that drives and controls the solid-state image sensor so as to selectively switch between operating in a first mode of capturing an image of a subject and a second mode of acquiring information regarding the distance to the subject,
wherein in the first mode of capturing, the control unit controls the counter so as to count the number of pulses of the pulse signal generated by the sensor unit when a light emitting unit does not emit light,
wherein in the second mode of acquiring information regarding the distance to the subject, the control unit controls the counter so as to count the number of pulses of a predetermined signal, the number depending on an elapsed time from a timing at which light is emitted from the light emitting unit, and
wherein when in the second mode, the control unit controls the counter so as to count the number of pulses of the predetermined signal from a timing at which light is emitted from the light emitting unit until a timing at which output of the comparator is inverted.

* * * * *